US009685355B2

(12) United States Patent
Hyakumura

(10) Patent No.: US 9,685,355 B2
(45) Date of Patent: Jun. 20, 2017

(54) LASER DICING DEVICE AND DICING METHOD

(71) Applicant: Tokyo Seimitsu Co., Ltd., Tokyo (JP)

(72) Inventor: Kazushi Hyakumura, Tokyo (JP)

(73) Assignee: TOKYO SEIMITSU CO., LTD., Tokyo (JP)

( * ) Notice: Subject to any disclaimer, the term of this patent is extended or adjusted under 35 U.S.C. 154(b) by 0 days.

(21) Appl. No.: 15/252,131

(22) Filed: Aug. 30, 2016

(65) Prior Publication Data

US 2016/0372349 A1 Dec. 22, 2016

Related U.S. Application Data

(63) Continuation of application No. PCT/JP2015/052711, filed on Jan. 30, 2015.

(30) Foreign Application Priority Data

Mar. 14, 2014 (JP) ................................ 2014-052095
Jan. 28, 2015 (JP) ................................ 2015-014324

(51) Int. Cl.
| | |
|---|---|
| H01L 21/67 | (2006.01) |
| B23K 26/046 | (2014.01) |
| B23K 26/00 | (2014.01) |
| B23K 26/04 | (2014.01) |
| B23K 26/08 | (2014.01) |
| B23K 26/53 | (2014.01) |
| H01L 21/78 | (2006.01) |

(Continued)

(52) U.S. Cl.
CPC .... *H01L 21/67092* (2013.01); *B23K 26/0006* (2013.01); *B23K 26/0057* (2013.01);
(Continued)

(58) Field of Classification Search
USPC ............ 219/121.68, 121.69, 121.76, 121.83; 438/463
See application file for complete search history.

(56) References Cited

U.S. PATENT DOCUMENTS 6,713,718 B1 * 3/2004 Lu ........................ B23K 26/032
219/121.69
8,431,861 B2 * 4/2013 Sawabe ................. B23K 26/03
219/121.83

(Continued)

FOREIGN PATENT DOCUMENTS

| JP | 2007167918 A | 7/2007 |
| JP | 2008058077 A | 3/2008 |

(Continued)

OTHER PUBLICATIONS

Tokyo Seimitsu Co., Ltd., International Search Report and Written Opinion, PCT/JP2015/052711, Mar. 3, 2015, 8 pgs.

(Continued)

*Primary Examiner* — Samuel M Heinrich
(74) *Attorney, Agent, or Firm* — Morgan, Lewis & Bockius LLP

(57) ABSTRACT

A laser dicing device includes a laser light source, an AF light source, a light path of the processing laser light and a light path of the AF laser light being partially shared with each other, a condenser lens arranged on the shared light path between the first laser light and the second laser light, an AF signal processing unit that generates a focus error signal based on reflected light of the AF laser light reflected by the surface of the wafer, a controller that moves the condenser lens such that a distance between the condenser lens and the surface of the wafer is made constant based on the focus error signal, and a focus lens group that adjusts the position of the condensing point of the AF laser light in a state where the position of the condensing point of the processing laser light is fixed.

18 Claims, 19 Drawing Sheets

(51) Int. Cl.
*H01L 21/268* (2006.01)
*B23K 26/03* (2006.01)
*B23K 26/0622* (2014.01)
*B23K 101/40* (2006.01)
*B23K 103/00* (2006.01)

(52) U.S. Cl.
CPC .......... *B23K 26/032* (2013.01); *B23K 26/046* (2013.01); *B23K 26/048* (2013.01); *B23K 26/0622* (2015.10); *B23K 26/0861* (2013.01); *B23K 26/53* (2015.10); *H01L 21/78* (2013.01); *B23K 2201/40* (2013.01); *B23K 2203/56* (2015.10); *H01L 21/268* (2013.01)

(56) References Cited

U.S. PATENT DOCUMENTS

| | | |
|---|---|---|
| 2005/0255716 A1 | 11/2005 | Tanaka et al. |
| 2009/0166342 A1 | 7/2009 | Kuno et al. |
| 2014/0038392 A1 | 2/2014 | Yonehara et al. |

FOREIGN PATENT DOCUMENTS

| | | |
|---|---|---|
| JP | 2009271289 A | 11/2009 |
| JP | 2010052014 A | 3/2010 |
| JP | 2011-210296 | 10/2011 |
| JP | 2011205115 A | 10/2011 |
| JP | 2013004584 A | 1/2013 |
| JP | 2013157452 A | 8/2013 |
| KR | 10-2006-0047578 | 5/2006 |
| KR | 10-2008-0086426 | 9/2008 |
| WO | WO2013126927 A2 | 8/2013 |

OTHER PUBLICATIONS

Tokyo Seimitsu Co., Ltd., International Preliminary Report on Patentability PCT/JP2015/052711, Aug. 18, 2015, 6 pgs.
Tokyo Seimitsu Co., Ltd., Korean Office Action, 10-2016-7024897, Feb. 2, 2017, 8 pages.
Tokyo Seimitsu Co., Ltd., Partial English Translation of the Korean Office Action, 10-2016-7024897, Feb. 2, 2017, 6 pages.

* cited by examiner

FIG.1
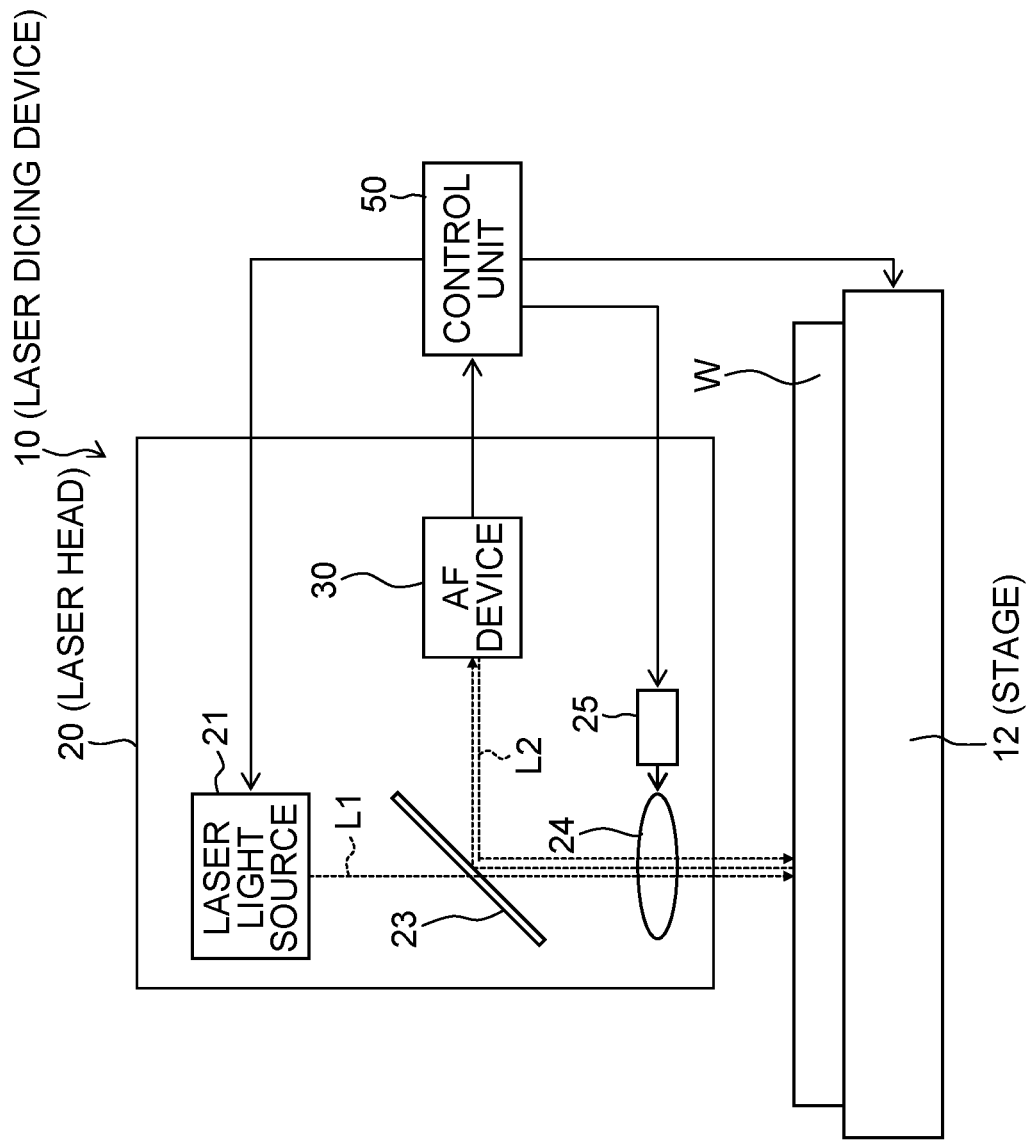
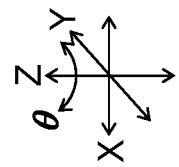

FIG.3
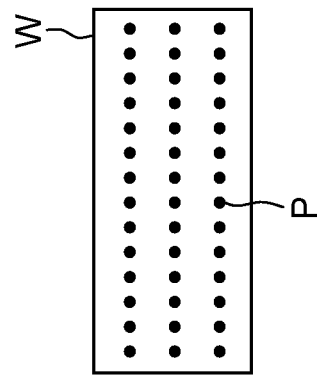
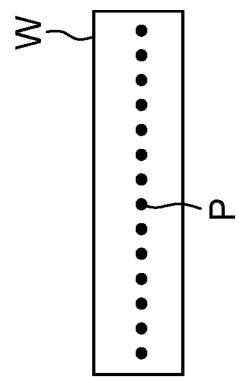
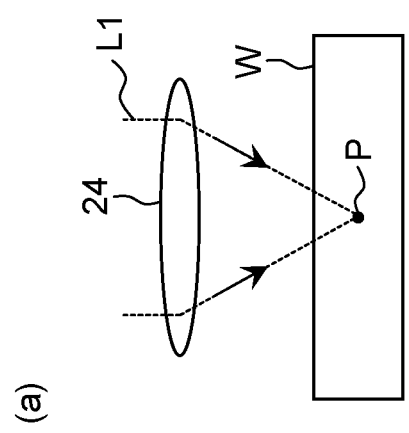

FIG.5
(a) h1
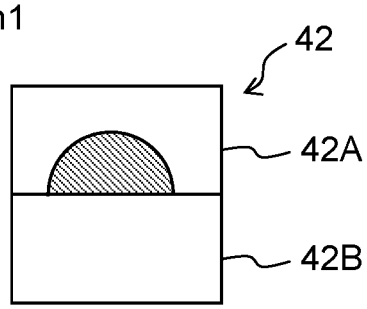
(b) h2
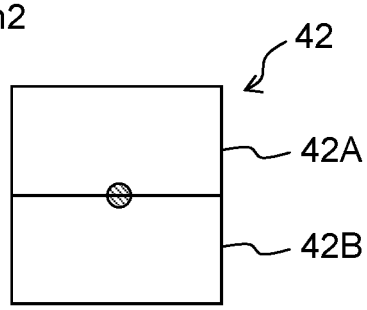
(c) h3
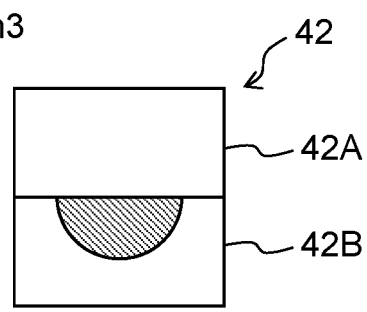

LASER DICING DEVICE AND DICING METHOD

CROSS-REFERENCE TO RELATED APPLICATIONS

This application is a Continuation of PCT International Application No. PCT/JP2015/052711 filed on Jan. 30, 2015, which claims priorities under 35 U.S.C. §119 to Japanese Patent Application No. 2014-052095 filed on Mar. 14, 2014 and Japanese Patent Application No. 2015-014324 filed on Jan. 28, 2015. Each of the above applications is hereby expressly incorporated by reference, in their entirety, into the present application.

BACKGROUND OF THE INVENTION

1. Field of the Invention

The present invention relates to a laser dicing device and a dicing method for dividing a wafer on which semiconductor devices, electronic components, or the like are formed, into respective chips.

2. Description of the Related Art

Conventionally, to divide a wafer, in which semiconductor devices, electronic components, or the like are formed on the surface, into respective chips, a dicing device has been used to form ground grooves in the wafer by a thin grindstone of about 30 μm thick made of small diamond abrasive grains, and cut the wafer.

In a dicing device, a thin grindstone (hereinafter referred to as a dicing blade) is rotated at a high speed of about 30,000 to 60,000 rpm to grind a wafer to thereby completely cut (full-cut) or incompletely cut (half-cut or semi-full cut) the wafer.

However, in the case of a grinding work performed by such a dicing blade, as a wafer is a high brittle material, processing is performed in a brittle mode. As such, chipping occurs on the surface and the rear face of the wafer. This chipping causes degradation in the performance of the divided chips. Particularly, the chipping occurred on the rear face has been a big problem because it causes cracks to gradually advance toward the inside the wafer.

To address such a problem, a laser dicing device has been proposed, in which a laser light is emitted with the condensing point focused inside a wafer to form a modified region inside the wafer by multiphoton absorption to thereby divide the wafer into respective chips, instead of conventional cutting by a dicing blade (see Japanese Patent Application Laid-Open No. 2007-167918, for example. hereinafter referred to as PTL 1). In such a laser dicing device, it is necessary to control the position of the condensing point of the laser light with high accuracy by detecting the position of the surface (height) of the wafer with use of an autofocus mechanism in order to form the modified region to be formed inside the wafer at a certain depth from the surface of the wafer.

For example, in the technology disclosed in PTL 1, a processing laser light for forming a modified region and an AF (for ranging) laser light for detecting the position of the surface of the wafer are condensed toward the wafer on a light path shared by the lasers by a condenser lens. At this time, the reflected light of the AF laser light reflected by the surface of the wafer is detected, and according to the detected signal, the position of the condenser lens is finely adjusted in a wafer thickness direction so as to allow the position of the condensing point of the processing laser light to be located at a position having a certain distance from the surface of the wafer. Thereby, it is possible to perform real time processing to form the modified region at a desired position inside the wafer, while controlling the position of the condensing point of the processing laser light so as to follow a displacement of the surface of the wafer.

SUMMARY OF THE INVENTION

Meanwhile, in a conventional laser dicing device as described above, as a condenser lens having a high numerical aperture (NA) (high NA lens) is used, sensitivity of the autofocus mechanism is extremely high, so that a range where highly accurate detection can be performed is limited to the vicinity of the focusing position. As such, a measurement range (focus setting range) in which the displacement of the surface of the wafer is detectable is extremely narrow. For example, measurement can be made only within a range of several μm (micro meters), in general. Further, when the condensing point of the processing laser light is changed in order to change the depth (hereinafter referred to as "processing depth") where the modified region is to be formed inside the wafer from the surface of the wafer, the position of the condensing point of the AF laser light is also changed along with the change of the depth, which makes it impossible to detect the displacement of the surface of the wafer. As such, it has been a problem that there is no degree of freedom (flexibility) to the change in the processing depth of the modified region.

For example, in the case of forming the modified region at a depth ranging from ten and several μm to more than seven hundreds μm from the surface of a wafer having a thickness of 775 μm the processing cannot be performed in real time because such a depth excess the measurement range of the autofocus mechanism for a thin wafer exceeds. In that case, it is necessary to perform measurement scanning in advance to measure and store the shape of the surface of the wafer, and then to perform a tracing work for processing the wafer based on the stored data of the wafer surface shape.

However, in such a method, because the measurement scanning is performed to measure and store the wafer surface shape in the previous stage of performing the actual processing, a time for performing the measurement scanning is required in addition to the actual processing. This is a factor causing lower throughput (processing efficiency).

On the other hand, while it may be possible to prepare autofocus mechanisms applicable to respective processing depths as separate units, it is not preferable because it causes a cost increase and complication of the device.

The present invention has been made in view of such a situation. The present invention aims to provide a laser dicing device and a dicing method capable of forming a modified region inside of a wafer with high accuracy, while having a high degree of freedom to the change in a processing depth of a modified region.

Solution to Problem

In order to achieve the object described above, a laser dicing device, according to a first aspect of the present invention, is a laser dicing device which forms a modified region inside a wafer by condensing a first laser light inside the wafer, including: a first laser light source configured to emit the first laser light; a second laser light source configured to emit a second laser light to be reflected by a surface of the wafer, the second laser light source having a light path which is partially shared with a light path of the first laser light; a condenser lens configured to condense the first laser light and the second laser light, the condenser lens being arranged on a shared light path between the light path of the first laser light and the light path of the second laser light; focus error signal generation means (focus error signal generator) configured to generate a focus error signal indicating a distance between a condensing point of the second laser light and the surface of the wafer, based on a reflected light of the second laser light reflected by the surface of the wafer; control means (controller) configured to move the condenser lens in a thickness direction of the wafer based on the focus error signal so as to make a distance between the condenser lens and the surface of the wafer constant; and condensing point adjusting means (condensing point adjuster) configured to adjust a position of the condensing point of the second laser light in the thickness direction of the wafer in a state where a position of a condensing point of the first laser light is fixed.

The laser dicing device according to a second aspect of the present invention is that, in the first aspect, the condensing point adjusting means includes a focus lens group which includes one or more lenses and is arranged at a position which is on the light path of the second laser light and is independent from the shared light path, and at least a part of the lenses of the focus lens group is configured to be movable along the light path of the second laser light.

The laser dicing device according to a third aspect of the present invention is that, in the second aspect, the focus lens group includes a positive lens and a negative lens arranged in this order from a side of the wafer, and the negative lens is configured to be movable along the light path of the second laser light.

The laser dicing device according to a fourth aspect of the present invention is that, in the third aspect, an optical distance between an exit pupil of the condenser lens and the positive lens is 120 mm or less.

The laser dicing device according to a fifth aspect of the present invention is that, in the third aspect or the fourth aspect, a focal distance of the positive lens is 20 mm or greater and 80 mm or less.

The laser dicing device according to a sixth aspect of the present invention is that, in any of the third aspect to the fifth aspect, a difference between the focal distance of the positive lens and a focal distance of the negative lens is 2 mm or greater and 15 mm or less.

The laser dicing device according to a seventh aspect of the present invention is that, in any of the third to the sixth aspects, a diameter of a condensed image of the first laser light condensed by the condenser lens and emitted to the surface of the wafer is 5 µm or greater and 50 µm or less.

The laser dicing device according to an eighth aspect of the present invention is that, in any of the first to the seventh aspects, the focus error signal generation means generates the focus error signal by a knife edge method.

The laser dicing device according to a ninth aspect of the present invention is that, in any of the first to the seventh aspects, the focus error signal generation means generates the focus error signal by an astigmatic method.

A dicing method according to a tenth aspect of the present invention, is a dicing method in which a modified region is formed inside a wafer by condensing a first laser light inside the wafer, including: a condensing step of condensing the first laser light and a second laser light to be reflected by a surface of the wafer by a condenser lens being arranged on a shared light path between a light path of the first laser light and a light path of the second laser light; a focus error signal generation step of generating a focus error signal indicating a distance between a condensing point of the second laser light and the surface of the wafer, based on a reflected light of the second laser light reflected by the surface of the wafer; a control step of moving the condenser lens in a thickness direction of the wafer based on the focus error signal so as to make a distance between the condenser lens and the surface of the wafer constant; and a condensing point adjusting step of adjusting a position of the condensing point of the second laser light in the thickness direction of the wafer in a state where a position of a condensing point of the first laser light is fixed.

The dicing method according to an eleventh aspect of the present invention is that, in the tenth aspect, the condensing point adjusting step adjusts the position of the condensing point of the second laser light in the thickness direction of the wafer by moving, along the light path of the second laser light, at least a part of lenses of a focus lens group which includes one or more lenses and is arranged at a position which is on the light path of the second laser light and is independent from the shared light path.

The dicing method according to a twelfth aspect of the present invention is that, in the eleventh aspect, the focus lens group includes a positive lens and a negative lens arranged in this order from a side of the wafer, and the condensing point adjusting step adjusts the position of the condensing point of the second laser light in the thickness direction of the wafer by moving the negative lens along the light path of the second laser light.

The dicing method according to a thirteenth aspect of the present invention is that, in the twelfth aspect, an optical distance between an exit pupil of the condenser lens and the positive lens is 120 mm or less.

The dicing method according to a fourteenth aspect of the present invention is that, in the twelfth aspect or the thirteenth aspect, a focal distance of the positive lens is 20 mm or greater and 80 mm or less.

The dicing method according to a fifteenth aspect of the present invention is that, in any of the twelfth to the fourteenth aspects, a difference between the focal distance of the positive lens and a focal distance of the negative lens is 2 mm or greater and 15 mm or less.

The dicing method according to a sixteenth aspect of the present invention is that, in any of the twelfth to the fifteenth aspects, a diameter of a condensed image of the first laser light condensed by the condenser lens and emitted to the surface of the wafer is 5 µm or greater and 50 µm or less.

The dicing method according to a seventeenth aspect of the present invention is that, in any of the tenth to the sixteenth aspects, in the focus error signal generation step, the focus error signal is generated by a knife edge method.

The dicing method according to an eighteenth aspect of the present invention is that, in any of the tenth to the sixteenth aspects, in the focus error signal generation step, the focus error signal is generated by an astigmatic method.

According to the present invention, as it is possible to adjust a relative distance between the condensing point of the first laser light (processing laser light) and the condensing point of the second laser light (AF laser light), the condensing point of the second laser light can be set in the vicinity of the surface of the wafer according to the processing depth of a modified region. As such, a displacement of the surface of the wafer can be detected stably with high accuracy. Accordingly, a degree of freedom (flexibility) to a change in the processing depth of a modified region can be improved, and it is possible to form a modified region at a desired position inside the wafer with high accuracy.

BRIEF DESCRIPTION OF THE DRAWINGS

FIG. 1 is a configuration diagram showing an outline of a laser dicing device according to an embodiment of the present invention.

FIG. 3 is conceptual views explaining a modified region to be formed in the vicinity of a condensing point inside a wafer.

FIG. 5 is diagrams showing states of a condensed image formed on a light receiving surface of a bisected photodiode.

DESCRIPTION OF THE EMBODIMENTS

Hereinafter, an embodiment of the present invention is described in accordance with the accompanying drawings.

FIG. 1 is a block diagram showing an outline of a laser dicing device 10 according to an embodiment of the present invention. As shown in the figure, the laser dicing device 10 includes a stage 12 for moving a wafer W, a laser head 20 for irradiating the wafer W with laser light, and a control unit 50 for controlling respective units of the laser dicing device 10.

Figure 2:
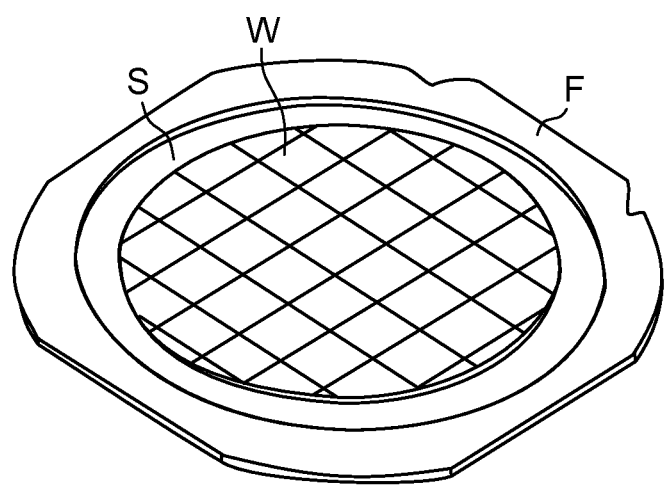
FIG. 2 is a perspective view showing a wafer mounted on a frame via a tape.

The stage 12 is configured to be movable in X, Y, Z, and θ directions, and adsorbs and holds the wafer W. As shown in FIG. 2, a dicing sheet S having an adhesive material is attached to one surface of the wafer W, and the wafer W is mounted on the stage 12 in a state where the wafer W is integrated with a frame F via the dicing sheet S.

The laser head 20 is arranged at a position facing the wafer W, and emits, to the wafer W, a processing laser light L1 for forming a modified region inside the wafer W by multiphoton absorption.

The control unit 50 includes a CPU (Central Processing Unit), a memory, an input/output circuit unit, and the like, and stores data necessary for operation of the respective units and processing of the laser dicing device 10, for example.

Besides those described above, the laser dicing device 10 also includes a wafer conveyance means, a control board, a television monitor, an indication lamp, and the like, not shown.

The control board is provided with switches for controlling operation of the respective units of the laser dicing device 10, and a display device. The television monitor displays a wafer image captured by a CCD (Charge Coupled Device) camera not shown, or displays program contents, various types of messages, and the like. The indication lamp shows operating states such as during processing, completion of processing, and emergency stop, of the laser dicing device 10.

Next, a detailed configuration of the laser head 20 is described.

As shown in FIG. 1, the laser head 20 includes a laser light source (first laser light source) 21, a dichroic mirror 23, a condenser lens 24, a first actuator 25, and an AF device 30.

The laser light source 21 emits a processing laser light (first laser light) L1 for forming a modified region inside the wafer W. For example, the laser light source 21 emits a laser light in which a pulse width is 1 μs or less and a peak power density at a condensing point is $1 \times 10^8$ (W/cm$^2$) or greater.

On a first light path of the processing laser light L1, the dichroic mirror 23 and the condenser lens 24 are arranged in this order from a side of the laser light source 21. The dichroic mirror 23 transmits the processing laser light L1 and reflects an AF laser light (second laser light) L2 emitted from an AF device 30 described below. It should be noted that a second light path of the AF laser light L2 is bent by the dichroic mirror 23 so as to share a light path partially with the first light path of the processing laser light L1, and the condenser lens 24 is arranged on the shared light path.

The processing laser light L1 emitted from the laser light source 21 passes through the dichroic mirror 23, and then, is condensed inside the wafer W by the condenser lens 24. A Z directional position (wafer thickness directional position) of the condensing point of the processing laser light L1 is adjusted by finely moving the condenser lens 24 in the Z direction by the first actuator 25. It should be noted that while the details are described below, driving of the first actuator 25 is controlled by the control unit 50 such that a distance between the condenser lens 24 and the surface of the wafer W is to be constant.

FIG. 3 is conceptual views explaining modified regions formed in the vicinity of a condensing point inside the wafer. Part (a) in FIG. 3 shows a state where the processing laser light L1 which enters inside the wafer W forms a modified region P at a condensing point, Part (b) in FIG. 3 shows a state where the wafer W is moved in a horizontal direction under the intermittent pulse-like processing laser light L1, whereby discontinuous modified regions P, P, . . . are formed in line. Part (c) in FIG. 3 shows a state where the modified regions P are formed in multiple layers inside the wafer W.

As shown in Part (a) in FIG. 3, when the condensing point of the processing laser light L1 which enters from the surface of the wafer W, is set inside the wafer W in a thickness direction, the energy of the processing laser light L1 which has passed through the surface of the wafer W is concentrated on the condensing point inside the wafer W to form the modified regions such as a crack region, a melt region, a refractive index changed region, and the like due to multiphoton absorption in the vicinity of the condensing point inside the wafer W. As shown in Part (b) in FIG. 3, by irradiating the he wafer W with the intermittent pulse-like processing laser light L1 to form the modified regions P, P, . . . along the dicing street, the balance between molecules collapses in the wafer W, whereby the wafer W is cut naturally with the modified regions P, P, . . . being the starting points, or with a slight external force applied.

Further, in the case of a thick wafer W, the wafer W cannot be cut by the modified regions P in one layer. As such, as shown in Part (c) in FIG. 3, the wafer W is cut such that the condensing point of the processing laser light L1 is moved in the thickness direction of the wafer W to thereby form the modified regions P in multiple layers.

While the examples shown in Part (b) and Part (c) in FIG. 3 illustrate states where discontinuous modified regions P, P, . . . are formed by the intermittent pulse-like processing laser light L1, a continuous modified region P may be formed under a continuous wave of the processing laser light L1. In the case of forming discontinuous modified regions P, cutting is less likely to be made compared with the case of forming a continuous modified region P. As such, whether to use a continuous wave or a discontinuous wave of the processing laser light L1 is appropriately selected according to the thickness of the wafer W and a safety condition and the like during conveyance.

The AF device 30 emits the AF laser light (second laser light) L2 for detecting displacement in the Z direction (wafer thickness direction) from the reference position of the surface of the wafer W, receives the reflected light of the AF laser light L2 reflected by the surface of the wafer W, and detects displacement in the Z direction from the reference position of the surface of the wafer W based on the received reflected light.

Figure 4:
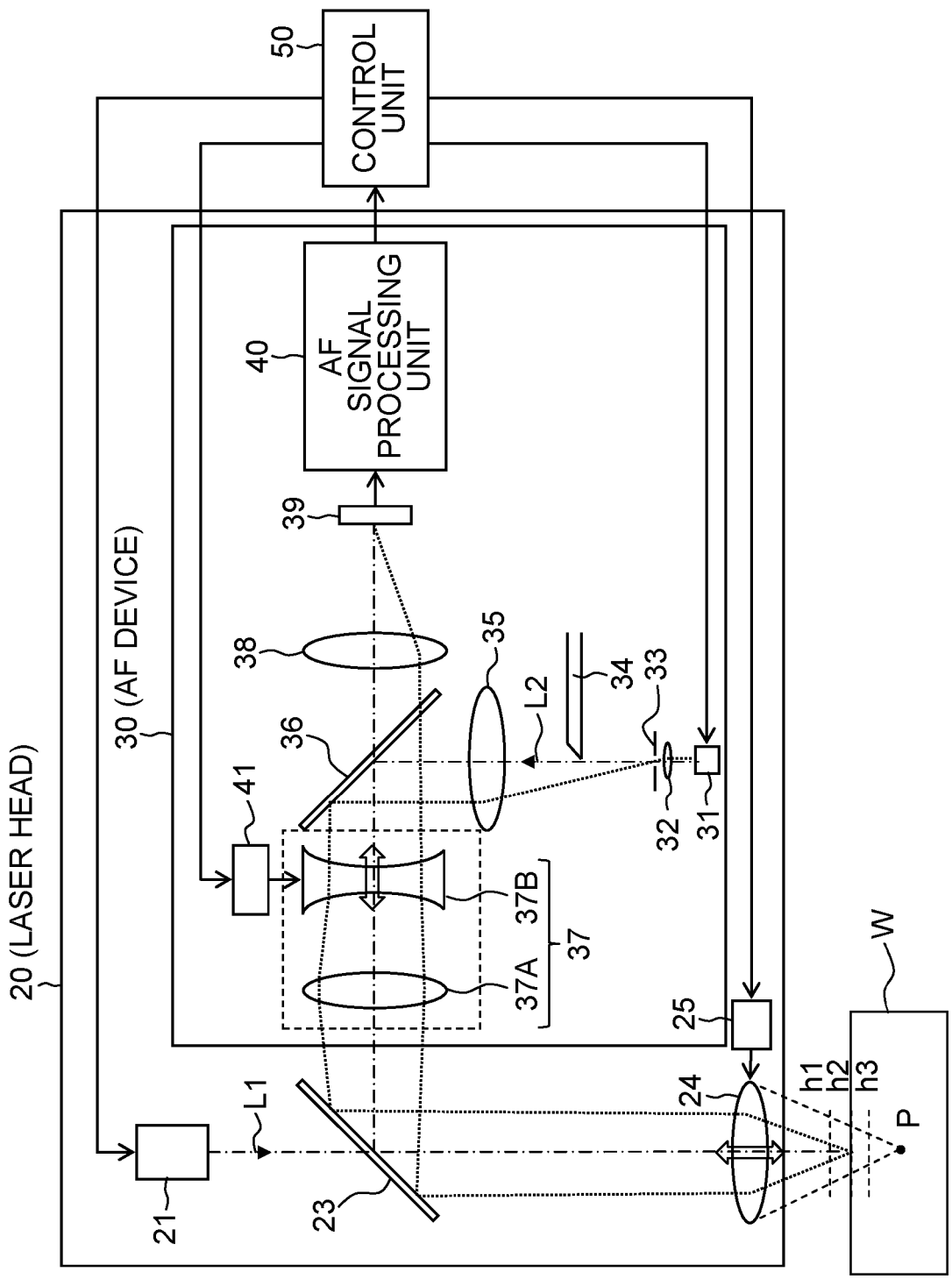
FIG. 4 is a schematic diagram showing an exemplary configuration of an AF device.

FIG. 4 is a schematic diagram showing an exemplary configuration of the AF device 30. The AF device 30 shown in FIG. 4 is configured to detect displacement from the reference position of the surface of the wafer W in the Z direction using a knife edge method.

The AF device 30 includes an AF light source (second laser light source) 31, a condenser lens 32, a pinhole 33, a knife edge 34, an illumination lens 35, a half mirror 36, a focus lens group 37, an imaging lens 38, a detector 39, an AF signal processing unit 40, and a second actuator 41.

The AF light source 31 includes an LD (Laser Diode) light source, an SLD (Super Luminescent Diode) light source, or the like, for example, and emits the AF laser light L2 having a wave length which is different from that of the processing laser light L1 and is able to be reflected by the surface of the wafer W.

The AF laser light L2 emitted from the AF light source 31 passes through the condenser lens 32 and the pinhole 33, and then, is partially shielded by the knife edge 34. Then, the light progressing without being shielded by the knife edge 34 passes through the illumination lens 35, and then, is reflected by the half mirror 36 and is guided to the dichroic mirror 23 via the focus lens group 37. The AF laser light L2 which has been reflected by the dichroic mirror 23 progresses along the light path shared with the processing laser light L1, and is condensed by the condenser lens 24, and is emitted to the wafer W. It should be noted that it is only necessary that the knife edge 34 is provided between the pinhole 33 and the half mirror 36. The same effect can be achieved even if the knife edge 34 is arranged after the illumination lens 35.

The AF laser light L2 which has been reflected by the surface of the wafer W returns to the condenser lens 24 and progresses along the shared light path, and is reflected by the dichroic mirror 23. The reflected light of the AF laser light L2, which has been reflected by the dichroic mirror 23, passes through the focus lens group 37 and the half mirror 36 sequentially. The reflected light of the AF laser light L2, which has passed through the half mirror 36, is condensed by the imaging lens 38, is emitted to the detector 39, and forms a condensed image on the light receiving surface of the detector 39.

The detector 39 is configured of a bisected photodiode having a light receiving element (photoelectric conversion element) segmented into two. The detector 39 receives, in a dividing manner, the condensed image of the reflected light of the AF laser light L2, and outputs output signals (electrical signals) corresponding to the respective light amounts to the AF signal processing unit 40.

The AF signal processing unit 40 generates a focus error signal indicating the displacement (defocusing distance between the surface of the wafer W and the condensing point of the AF laser light L2) of the surface of the wafer W from the reference position in the Z direction, based on the output signals output from the respective light receiving elements of the detector 39, and outputs the focus error signal to the control unit 50. It should be noted that the AF signal processing unit 40 corresponds to a focus error signal generation means of the present invention.

Here, a principle of detecting the displacement of the surface of the wafer W is described.

FIG. 5 is diagrams showing states of the condensed image formed on the light receiving surface of the bisected photodiode 42 constituting the detector 39. It should be noted that Part (a) to Part (c) in FIG. 5 illustrate states of the condensed image formed on the light receiving surface of the bisected photodiode 42 when the surface of the wafer W is located at positions designated by reference characters h1, h2, and h3 in FIG. 4, respectively.

First, when the surface of the wafer W is located at the position h2, that is, when the surface of the wafer W and the condensing point of the AF laser light L2 match, a sharp image (perfect circle) is formed at the center of the light receiving surface of the bisected photodiode 42 as shown in Part (b) in FIG. 5. At this time, the light amounts received by the light receiving elements 42A and 42B of the bisected photodiode 42 are equal, and it is understood that the surface of the wafer W is located at the focusing position.

Meanwhile, when the surface of the wafer W is located at the position h1, that is, when the surface of the wafer W is located at a position closer to the condenser lens 24 than the condensing point of the AF laser light L2, a semicircular condensed image is formed on the light receiving element 42A side on the light receiving surface of the bisected photodiode 42 as shown in Part (a) in FIG. 5, and the size (blur amount) varies according to the distance between the wafer W and the condenser lens 24.

Meanwhile, when the surface of the wafer W is located at the position h3, that is, when the surface of the wafer W is located at a position farther from the condenser lens 24 than the condensing point of the AF laser light L2, a semicircular condensed image is formed on the light receiving element 42B side on the light receiving surface of the bisected photodiode 42 as shown in Part (c) in FIG. 5, and the size (blur amount) varies according to the distance between the wafer W and the condenser lens 24.

As described above, the light amounts received by the light receiving elements 42A and 42B of the bisected photodiode 42 vary according to the displacement of the surface of the wafer W. As such, it is possible to detect the displacement of the surface of the wafer W with use of such a property.

In the AF signal processing unit 40, the focus error signal E is obtained according to the following Expression (1), where A and B represent output signals output from the light receiving element 42A and 42B of the bisected photodiode 42, respectively.

$$E=(A-B)/(A+B) \tag{1}$$

Figure 6:
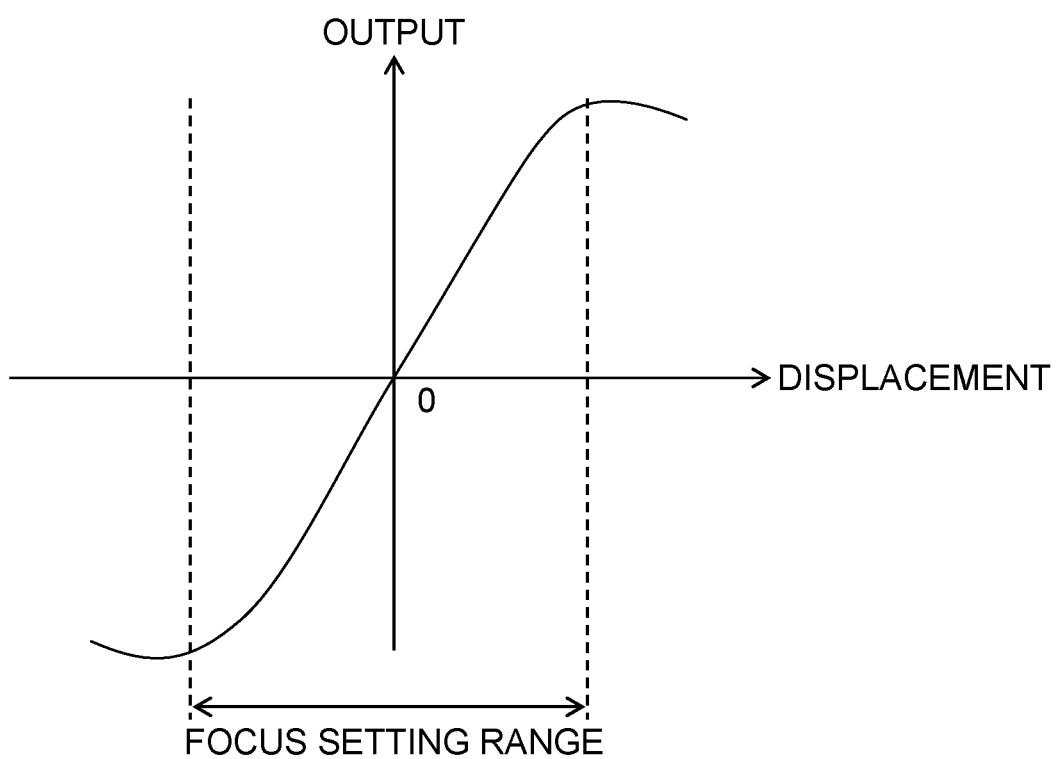
FIG. 6 is a graph showing the output characteristics of a focus error signal.

FIG. 6 is a graph showing the output characteristics of the focus error signal, in which the horizontal axis shows the displacement from the reference position of the surface of the wafer W in the Z direction (wafer thickness direction), and the vertical axis shows an output value of the focus error signal. It is assumed that the condensing point of the AF laser light L2 has been adjusted to match the reference position (origin) of the surface of the wafer W in advance.

As shown in FIG. 6, the output characteristics of the focus error signal are expressed as an S-shaped curve with the reference position (origin) of the surface of the wafer W being a zero-cross point. Further, when the position of the surface of the wafer W is within a range indicated by an arrow in the figure, that is, within a measurement range (focus setting range) where the displacement of the surface of the wafer W is detectable, a relationship between the displacement of the surface of the wafer W and the output of the focus error signal forms a monotonous curve passing through the origin. This means that when the output of the focus error signal is zero, it is found that the surface of the wafer W is at a focusing position matching the condensing point of the AF laser light L2, while when the output of the focus error signal is not zero, the displacement direction and the amount of displacement of the surface of the wafer W can be known.

A focus error signal having such output characteristics is generated by the AF signal processing unit 40 as wafer displacement information showing the displacement in the Z direction from the reference position of the surface of the wafer W, and is output to the control unit 50.

The control unit 50 controls driving of the first actuator 25 such that a distance between the condenser lens 24 and the surface of the wafer W becomes constant based on the focus error signal output from the AF signal processing unit 40. Thereby, the condenser lens 24 is finely moved in the Z direction (wafer thickness direction) so as to follow the displacement of the surface of the wafer W, and the condensing point of the processing laser light L1 is positioned with a constant distance (depth) from the surface of the wafer W. Thus, a modified region can be formed at a desired position inside the wafer W. It should be noted that the control unit 50 corresponds to a control means of the present invention.

Meanwhile, in the configuration where the condenser lens 24 is arranged on the shared light path between the first light path of the processing laser light L1 and the second light path of the AF laser light L2 as in the present embodiment, when a relative distance between the condenser lens 24 and the wafer W varies in order to change the processing depth of the modified region, the Z-directional position of the condensing point of the AF laser light L2 with respect to the wafer W is changed, along as well as the condensing point of the processing laser light L1.

Figure 7:
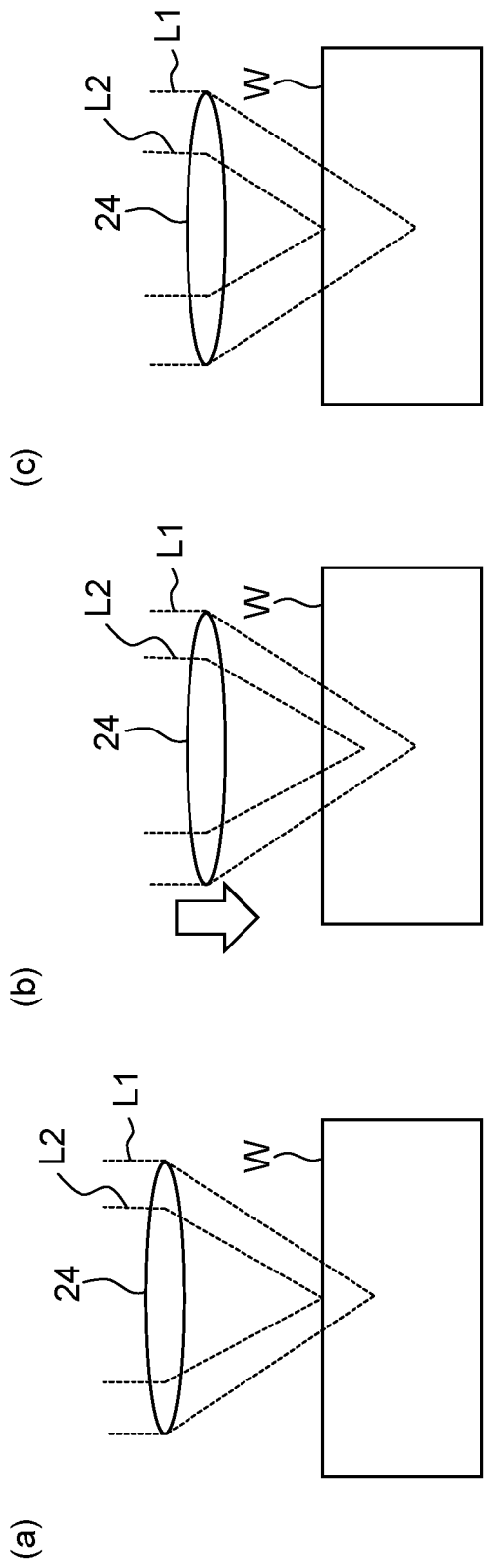
FIG. 7 is a diagram showing states where a condensing point of AF laser light is changed in a wafer thickness direction.

For example, as shown in Part (a) in FIG. 7, in the case where the modified region is formed at a shallow position from the surface of the wafer W, it is assumed that the condensing point of the AF laser light L2 matches the surface of the wafer W. In that case, when a relative distance between the condenser lens 24 and the wafer W is changed to form the modified region at a deep position from the surface of the wafer W as shown in Part (b) in FIG. 7, the condensing point of the AF laser light L2 is largely displaced in the Z direction (wafer thickness direction) from the surface of the wafer W. Then, when the distance between the condensing point of the AF laser light L2 and the surface of the wafer W exceeds the measurement range (focus setting range), the displacement of the surface of the wafer W cannot be detected. In particular, because a high NA lens is used as the condenser lens 24, the measurement range in which the displacement of the surface of the wafer W is detectable is limited to the vicinity of the condensing point (focusing position), this problem is more remarkable.

As such, the AF device 30 of the present embodiment includes the focus lens group 37 as a condensing point adjusting means for changing the condensing point of the AF laser light L2 in the Z direction (wafer thickness direction) independently from the condensing point of the processing laser light L1.

The focus lens group 37 is arranged at a position which is on the second light path of the AF laser light L2 and is independent from the shared light path with the first light path of the processing laser light L1. Specifically, the focus lens group 37 is arranged between the dichroic mirror 23 and the half mirror 36.

The focus lens group 37 is configured of a plurality of lenses including at least a movable lens configured to be movable along the second light path. In this example, the focus lens group 37 is configured of a fixed lens (positive lens) 37A provided to be immovable along the second light path, and a movable lens (negative lens) 37B provided to be movable along the second light path, arranged in this order from the subject side (wafer W side).

The second actuator 41 moves the movable lens 37B along the second light path. When the movable lens 37B moves along the second light path, the Z directional position of the condensing point of the AF laser light L2 is changed according to the moving direction and the moving amount of the movable lens 37B, while the Z directional position of the condensing point of the processing laser light L1 is in a fixed state. This means that a relative distance between the condensing point of the processing laser light L1 and the condensing point of the AF laser light L2 varies.

The control unit 50 controls driving of the second actuator 41 such that the condensing point of the AF laser light L2 matches the surface of the wafer W based on the focus error signal output from the AF signal processing unit 40 (specifically, such that the focus error signal becomes zero).

In this way, by controlling driving of the second actuator 41 by the control unit 50 based on the focus error signal output from the AF signal processing unit 40, it is possible to allow the condensing point of the AF laser light L2 to match the surface of the wafer W, independently from the condensing point of the processing laser light L1.

Thereby, as even in the case where the relative distance between the condenser lens 24 and the wafer W is changed to change the processing depth of the modified region from the state shown in Part (a) in FIG. 7 to the state shown in Part (b) in FIG. 7, by moving the movable lens 37B of the focus lens group 37 along the second light path as described above, it is possible to match the condensing point of the AF laser light L2 to the surface of the wafer W, in a state where the Z directional position of the condensing point of the processing laser light L1 is fixed as in the state shown in Part (c) in FIG. 7.

The grounds that such a configuration of the focus lens group 37 is preferable are described.

In a state of internal processing in which the condensing point of the processing laser light L1 is set inside the wafer W, when the relative distance between the condenser lens 24 and the wafer W is decreased, the AF laser light L2 condensed on the surface of the wafer W becomes divergent light from the condenser lens 24. Although there is also a group of negative lens leading type, as the focus lens group 37, in consideration of the fact that the light from the condenser lens 24 is divergent light, a group of a positive lens leading type as that of the present embodiment is reasonable. Regarding which of a positive lens (group) and a negative lens (group) is moved to perform the condensing point adjustment (focus adjustment), either a type in which the positive lens is moved (positive lens moving type) or a type in which the negative lens is moved (negative lens moving type) is possible. However, it is preferable that variation in a composite focal distance of the condenser lens 24 and the focus lens group 37, due to the condensing point adjustment, is as small as possible. From this point of view, the negative lens moving type is preferable.

On the above-described grounds, as for the focus lens group 37, a configuration including the fixed lens (positive lens) 37A and the movable lens (negative lens) 37B, arranged sequentially from a subject (wafer W side), is preferably adopted in the present embodiment.

Figure 8:
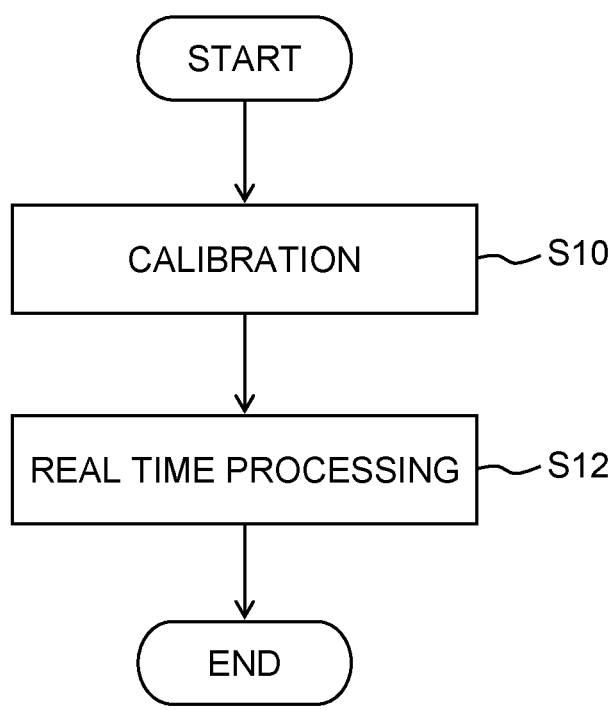
FIG. 8 is a flowchart showing a flow of a dicing method with use of a laser dicing device of the present embodiment.

Next, a dicing method using the laser dicing device 10 of the present embodiment is described. FIG. 8 is a flowchart showing a flow of a dicing method using the laser dicing device 10 of the present embodiment. It should be noted that as shown in FIG. 3, it is assumed that a dicing sheet S, having an adhesive material is attached to one surface of the wafer W and the wafer W is adsorbed and held on the stage 12 in a state where the wafer W is integrated with the frame F via the dicing sheet S. Further, the wafer W which is adsorbed and held by the stage 12 is subjected to alignment appropriately by an alignment means (not shown) having an image processing device.

As shown in FIG. 8, the laser dicing device 10 performs calibration operation for measuring the output characteristics of an autofocus error signal, prior to real time processing operation described below (step S10).

After completion of the calibration operation, the laser dicing device 10 performs real time processing operation to form a modified region inside the wafer W, while adjusting the Z directional position of the condensing point of the processing laser light L1 so as to follow the displacement of the surface of the wafer W (step S12).

Figure 9:
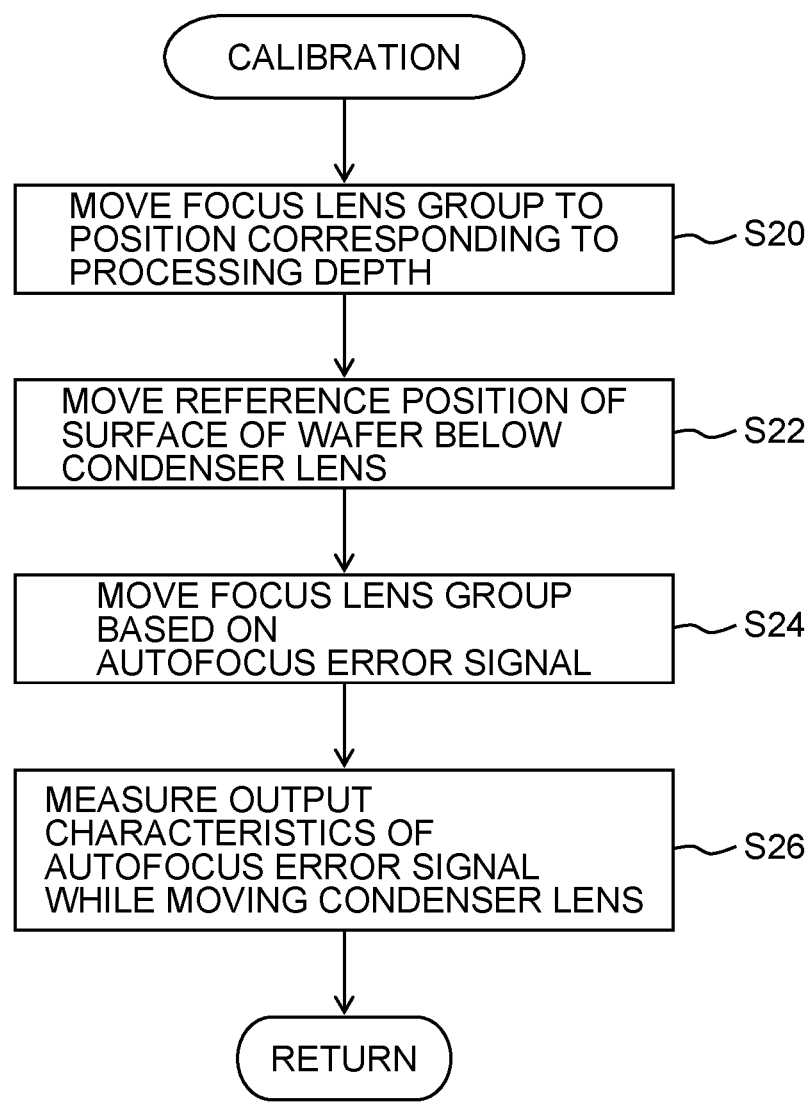
FIG. 9 is a flowchart showing a detailed flow of calibration operation shown in FIG. 8.

FIG. 9 is a flowchart showing a detailed flow of the calibration operation shown in FIG. 8.

First, the control unit 50 controls driving of the second actuator 41 to move the movable lens 37B of the focus lens group 37 to a position corresponding to the processing depth of the modified region (step S20). It should be noted that in a memory unit (not shown) of the control unit 50, a correspondence relation between the processing depth of the modified region and the position of the movable lens 37B of the focus lens group 37 is maintained.

Then, the control unit 50 controls movement of the stage 12 to move the reference position of the surface of the wafer W to immediately below the condenser lens 24 (step S22). It should be noted that it is desirable that the reference position is a portion having less level differences (smooth surface) on the surface of the wafer W because the reference position of the surface of the wafer W is a position at which the condensing point of the AF laser light L2 is matched and the reference position serves as a reference of the displacement in the Z directional position of the surface of the wafer W. For example, a predetermined position in a center portion excluding the outer peripheral portion of the wafer W is used as the reference position.

Then, as a condensing point adjusting step, the control unit 50 controls driving of the second actuator 41 to move the movable lens 37B of the focus lens group 37 along the second light path such that the autofocus error signal which is output from the AF signal processing unit 40, becomes zero (step S24). Thereby, as shown in Part (b) in FIG. 7, even in the case where there is a displacement (deviation) between the condensing point of the AF laser light L2 and the reference position of the surface of the wafer W, the condensing point adjustment is performed such that the condensing point of the AF laser light L2 matches the reference position of the surface of the wafer W, as shown in Part (c) in FIG. 7. It should be noted that the control unit 50 rewrites the position of the movable lens 37B of the focus lens group 37 which is stored in the memory unit (not shown) to the position (corrected position) of the movable lens 37B after the condensing point adjustment.

Then, the control unit 50 controls driving of the first actuator 25 to measure the output characteristics of the autofocus error signal output from the AF signal processing unit 40, while moving the condenser lens 24 along the Z direction across the entire movable range, and stores the output characteristics in the memory unit (not shown) as a lookup table (step S26).

It should be noted that in the case of forming a plurality of layers of modified regions inside the wafer W, the processing from step S20 to step S26 is performed for each processing depth of the modified region.

Through the processing described above, in the real time processing operation of step S12 in FIG. 8, the control unit 50 refers to the lookup table stored in the memory unit (not shown) to thereby be able to easily calculate the displacement (defocus distance between the surface of the wafer W and the condensing point of the AF laser light L2) in the Z direction from the reference position of the surface of the wafer W, from an output value of the autofocus error signal output from the AF signal processing unit 40. As such, processing efficiency (throughput) in the real time processing operation can be improved.

Figure 10:
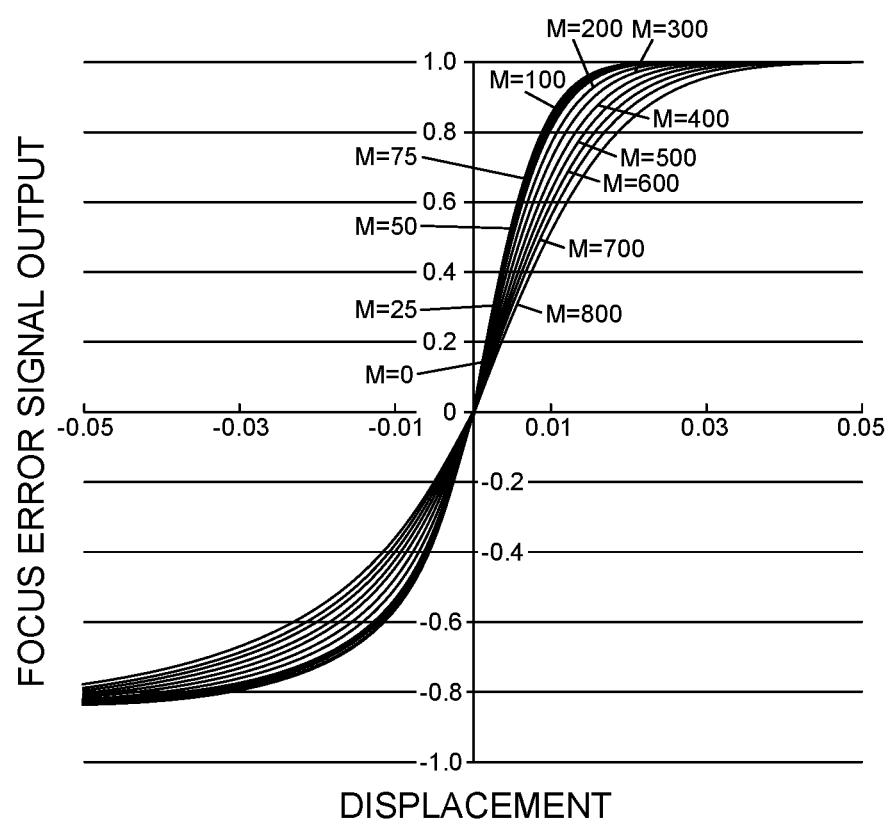
FIG. 10 is a diagram showing exemplary output characteristics of focus error signals measured by calibration operation.

FIG. 10 is a diagram showing exemplary output characteristics of focus error signals measured in the calibration operation, and illustrating the output characteristics in the case where the processing depth M of the modified region is changed within a range from 0 to 800 μm.

In the present embodiment, the Z directional position of the condensing point of the AF laser light L2 is adjusted to match the reference position of the surface of the wafer W according to the processing depth of the modified region. Thus, as shown in FIG. 10, the output characteristics of the focus error signals corresponding to the respective processing depths are almost uniform, and all of them are expressed as S-shaped curves with the reference position (origin) of the surface of the wafer W being the zero cross point. As such, by performing the real time processing operation with use of the focus error signal having such output characteristics, it is possible to detect the displacement of the surface of the wafer W stably with high accuracy, without being affected by a change in the processing depth of the modified region.

Figure 11:
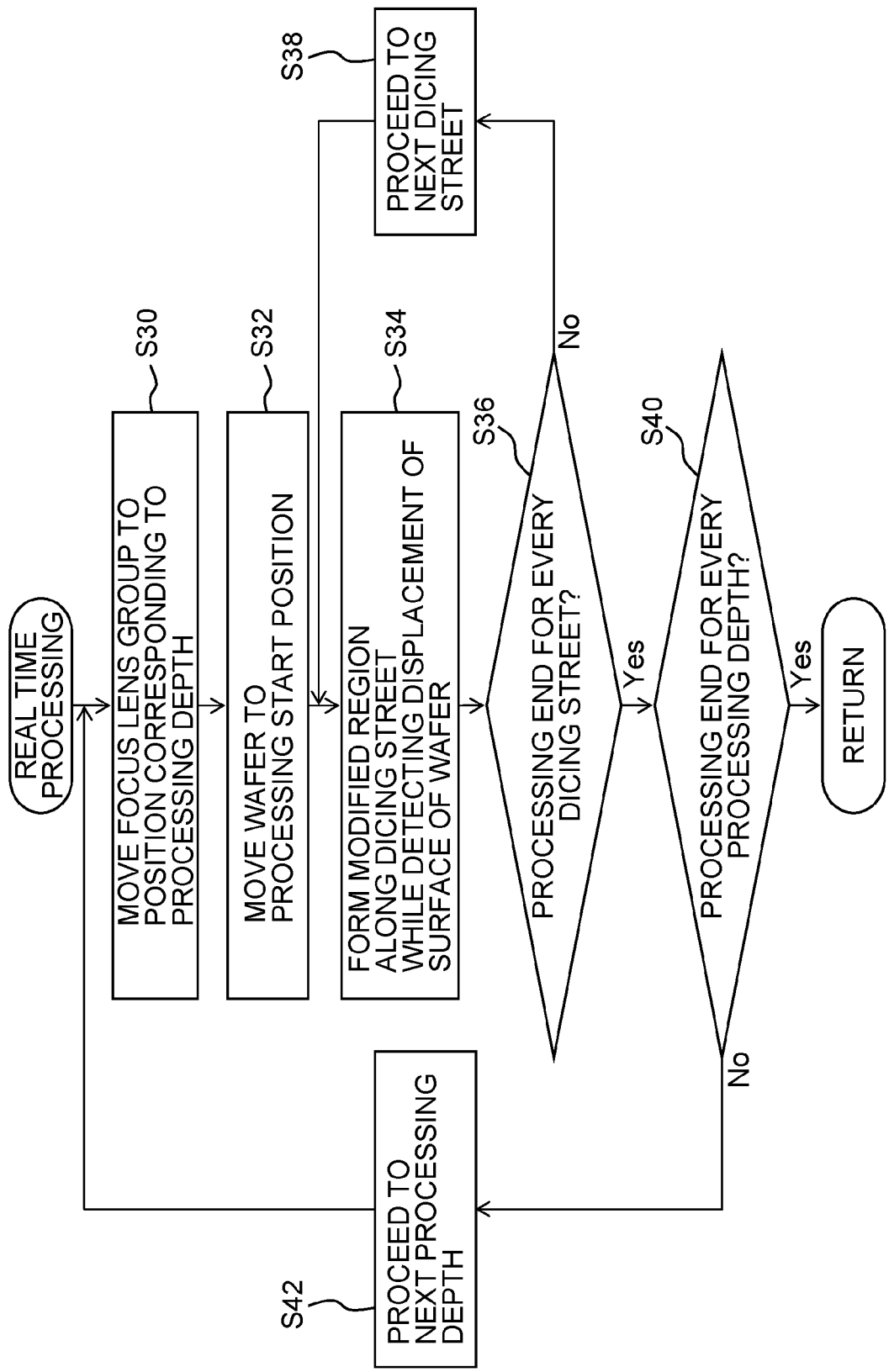
FIG. 11 is a flowchart showing a detailed flow of real time processing operation shown in FIG. 8.

FIG. 11 is a flowchart showing a detailed flow of the real time processing operation shown in FIG. 8.

First, similar to step S20 of FIG. 9, the control unit 50 controls driving of the second actuator 41 to move the movable lens 37B of the focus lens group 37 to a position corresponding to the processing depth of the modified region (step S30). At this time, the control unit 50 moves the movable lens 37B to the position (corrected position) stored in the memory unit (not shown). Thereby, the condensing point of the AF laser light L2 matches the reference position of the surface of the wafer W, and the AF device 30 is able to detect the displacement in the Z direction with the reference position of the surface of the wafer W, used as a reference.

Then, the control unit 50 controls movement of the stage 12 to move the wafer W which is adsorbed and held by the stage 12 to a predetermined processing start position (step S32).

Then, after turning on the laser light source 21, the control unit 50 forms the modified region inside the wafer W along the dicing street, by the processing laser light L1 emitted from the laser light source 21, while moving the wafer W in the horizontal direction (XY direction) (step S34).

At this time, at substantially the same time when the laser light source 21 is turned on or a time before it, the control unit 50 turns on the AF light source 31. Thereby, as a condensing step, the processing laser light L1 and the AF laser light L2 are condensed toward the wafer W by the condenser lens 24. The AF laser light L2 emitted from the AF light source 31 is reflected by the surface of the wafer W, and the reflected light forms a condensed image on the light receiving surface of the detector 39. As a focus error signal generation step, the AF signal processing unit 40 generates a focus error signal showing the displacement in the Z direction from the reference position of the surface of the wafer W based on an output signal (electrical signal) output from the detector 39, and outputs the generated focus error signal to the control unit 50.

Then, as a control step, the control unit 50 controls driving of the first actuator 25 based on the focus error signal output from the AF signal processing unit 40 to thereby form the modified region inside the wafer W while adjusting the Z directional position of the condensing point of the processing laser light L1.

Then, the control unit 50 determines whether or not formation of the modified region has been completed with respect to every dicing street of the wafer W (step S36). If the formation of the modified region has not been completed with respect to every dicing street (in the case of No), the processing proceeds to the next dicing street (step S38), and processing from step S34 to step S36 is repeated for the next dicing street. On the other hand, if the formation of the modified region has been completed with respect to every dicing street (in the case of Yes), the processing proceeds to the next step, that is, step S40.

Then, the control unit 50 determines whether or not formation of the modified region has been completed with respect to every processing depth (step S40). If the formation of the modified region has not been completed with respect to every processing depth, the processing moves to the next processing depth (step S42), and the processing from step S30 to step S36 is repeated. On the other hand, if formation of a modified region has been completed with respect to every processing depth, the real time processing operation ends.

In this way, by forming the modified region at a desired position inside the wafer, it is possible to divide the wafer W into chips with the modified region being the starting point.

As described above, according to the present embodiment, because the focus lens group 37 is provided as a condensing point adjusting means capable of adjusting the Z directional position (wafer thickness directional position) of the condensing point of the AF laser light L2 independently from the condensing point of the processing laser light L1, the relative distance between the condensing point of the processing laser light L1 and the condensing point of the AF laser light L2 can be adjusted. Thereby, it is possible to match the condensing point of the AF laser light L2 to the vicinity of the surface of the wafer W according to the processing depth of the modified region, and the displacement of the surface of the wafer W can be detected stably with high accuracy. Accordingly, it is possible to form the modified region at the desired position inside the wafer with high accuracy, while having a high degree of freedom to the change in the processing depth of the modified region.

Meanwhile, according to the earnest consideration by the present inventor, it is found that an optical distance between the condenser lens 24 and the focus lens group 37 is correlated with the focus setting range and the focus sensitivity, and that it is necessary to keep the optical distance D within a certain range to achieve a good result. Specifically, when the optical distance D between the exit pupil of the condenser lens 24 and the fixed lens (positive lens) 37A of the focus lens group 37 is too long, variation in the output characteristics of focus error signals for the respective processing depths increases. As such, it is preferable that the optical distance D is 120 mm or less.

Figure 12:
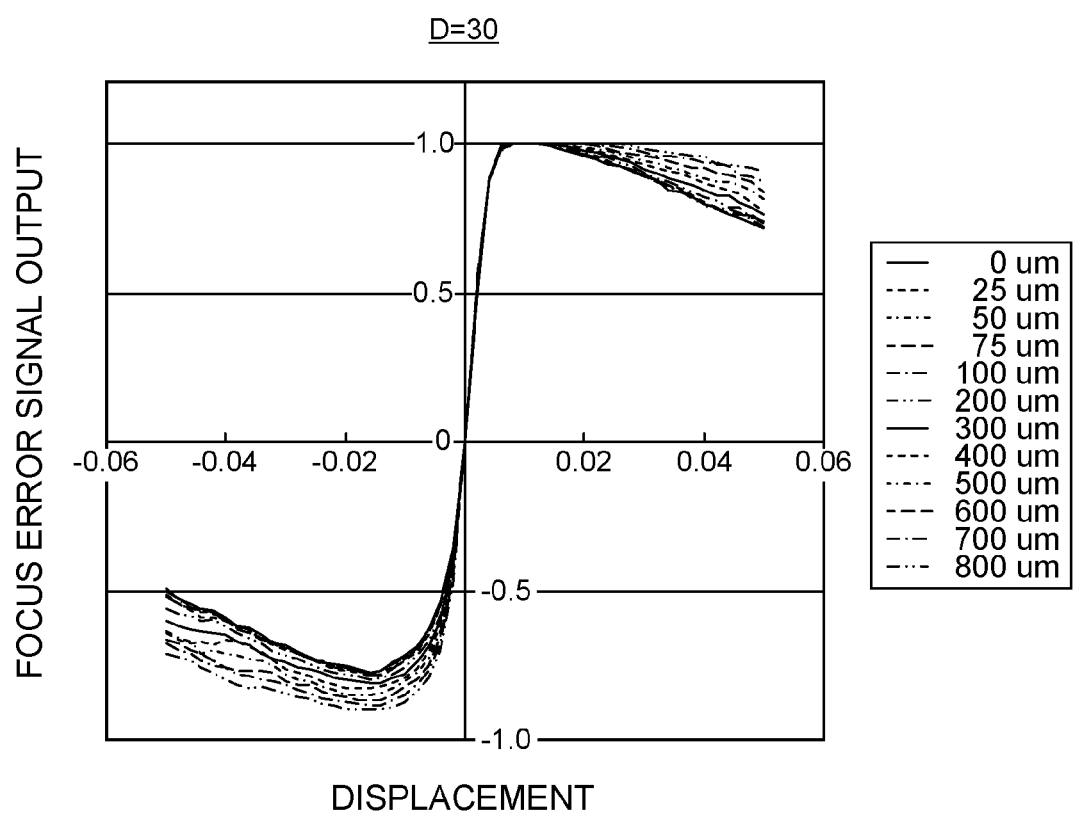
FIG. 12 is a diagram showing an evaluation result (output characteristics of focus error signals for respective processing depth) obtained by simulation.
Figure 13:
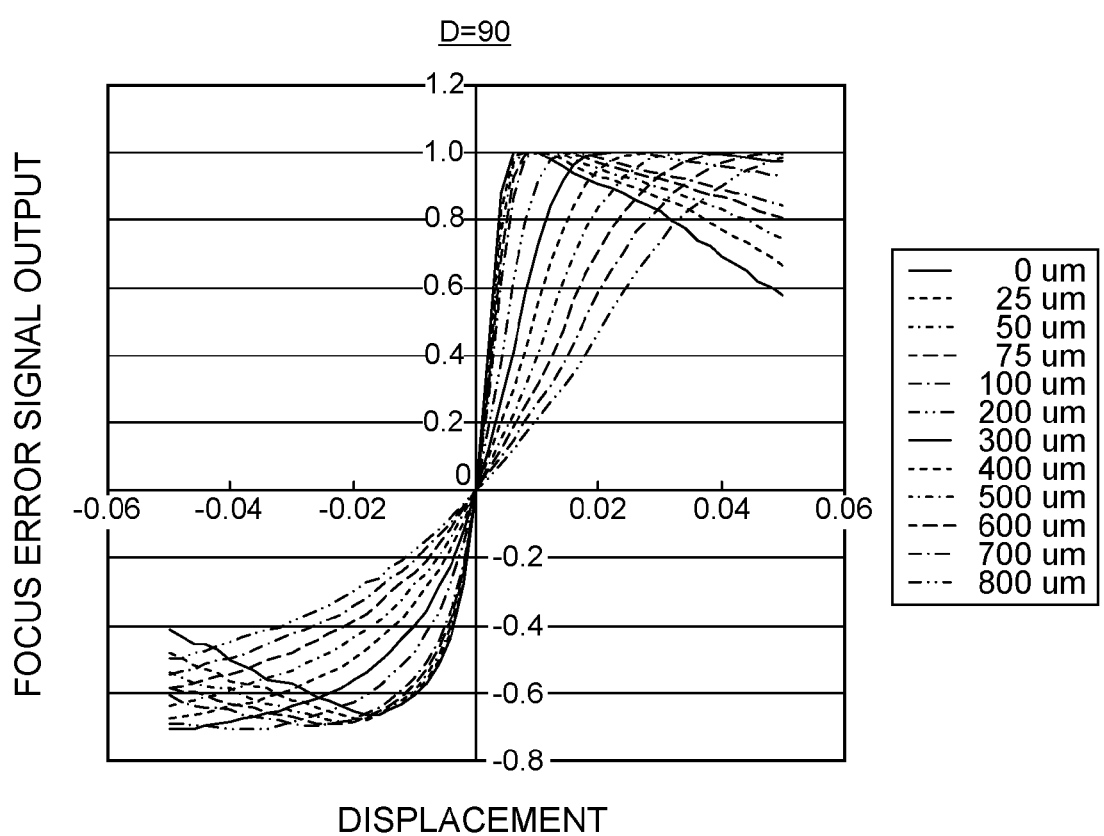
FIG. 13 is a diagram showing an evaluation result (output characteristics of focus error signals for respective processing depth) obtained by simulation.

Here, with reference to FIGS. 12 and 13, explanation is given on the result of evaluating changes in the output characteristics (AF characteristics) of focus error signals for respective processing depths when the optical distance D is changed, through a simulation performed using a model substantially equivalent to the above-described laser dicing device 10 of the present embodiment.

FIGS. 12 and 13 illustrate the output characteristics of focus error signals for respective processing depths when the optical distance D is set to predetermined values respectively. It should be noted that the unit of D is mm (hereinafter the same applies).

FIG. 12 shows the case where D=30, and FIG. 13 shows the case where D=90. As shown in these figures, as the optical distance D increases, the focus setting range is also enlarged, but inclinations of the output characteristic curves of focus error signals (inclinations of almost linear portions in a proportional relation around the focusing position (that is, displacement=0)) become gentle and the focus sensitivity tends to be decreased. Further, variations in the output characteristics of the focus error signals for the respective processing depths increase.

As such, it is preferable that the optical distance D between the exit pupil of the condenser lens 24 and the fixed lens 37A of the focus lens group 37 is 120 mm or less. Thereby, it is possible to obtain an AF characteristic which has high focus sensitivity, has a wide focus setting range, and is stable regardless of the processing depth.

Further, while the focus lens group 37 is configured of the fixed lens (positive lens) 37A and the movable lens (negative lens) 37B in the present embodiment, it is preferable that the focal distance of the fixed lens 37A is 20 mm or greater and 80 mm or less. When the focal distance of the fixed lens 37A is too long, the amount of movement of the movable lens 37B increases too much. Further, when the focal distance of the fixed lens 37A is too short, the variations in the output characteristics of the focus error signals for the respective processing depths increase. As such, in consideration of these points, it is preferable that the focal distance of the fixed lens 37A is in the above-described range, which enables the moving amount of the movable lens 37B to be reduced, and enables variations in the output characteristics of the focus error signals for the respective processing depths to be reduced.

Further, in the present embodiment, it is preferable that a difference between the focal distance (absolute value) of the fixed lens 37A and the focal distance (absolute value) of the movable lens 37B is 2 mm or greater and 15 mm or less. When the difference between the focal distances of the fixed lens 37A and the movable lens 37B is less than 2 mm, the distance between the fixed lens 37A and the movable lens 37B becomes too short when the condensing point of the AF laser light L2 is adjusted to the surface of the wafer W, which brings difficulty in configuring the focus lens group 37. On the other hand, when the difference between the focal distances is too large, the focal distance of the movable lens 37B becomes small, which is undesirable from the viewpoint of aberration. In consideration of these points, it is preferable that the difference between the focal distance (absolute value) of the fixed lens 37A and the focal distance (absolute value) of the movable lens 37B is 2 mm or greater and 15 mm or less. With this configuration, the focus lens group 37 can be configured easily, and occurrence of aberration can be suppressed.

Further, in the present embodiment, it is preferable that the diameter (spot diameter) N of a condensed image (pinhole image) of the AF laser light L2, the condensed image being condensed by the condenser lens 24 and emitted to the surface of the wafer W, is 5 μm or greater and 50 μm or less.

Figure 14:
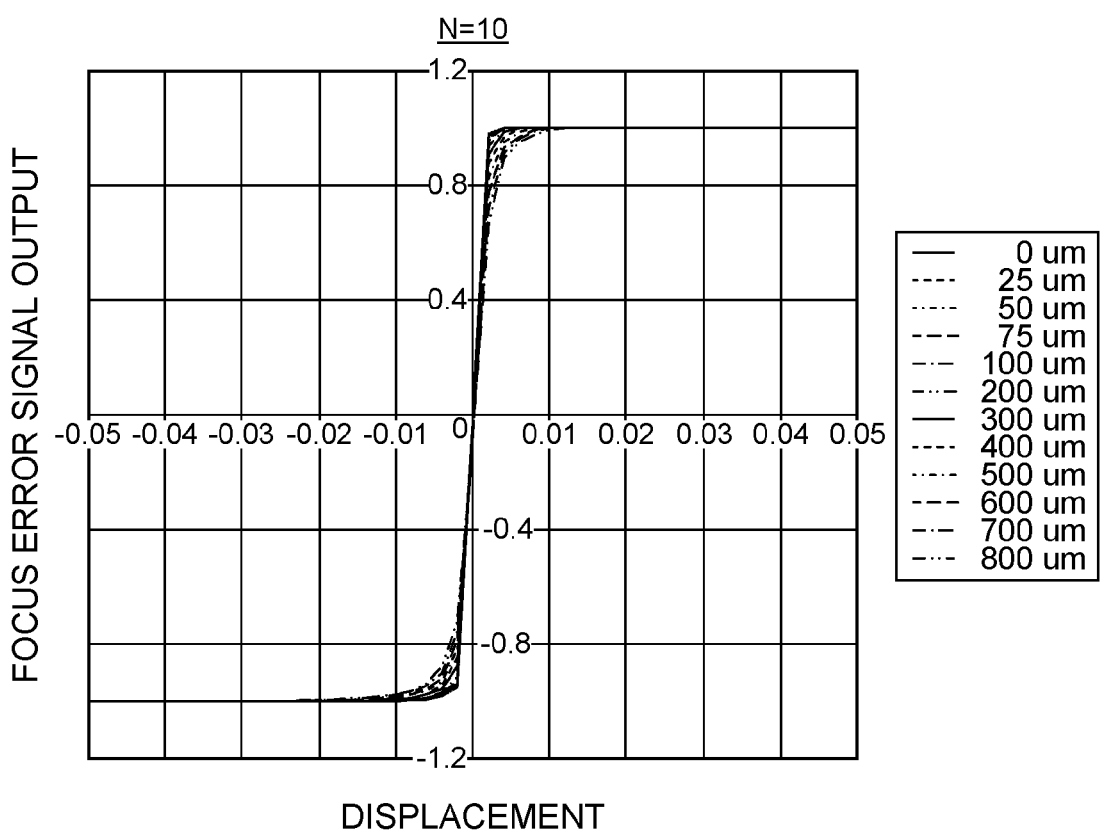
FIG. 14 is a diagram showing an evaluation result (output characteristics of focus error signals for respective processing depth) obtained by simulation.
Figure 15:
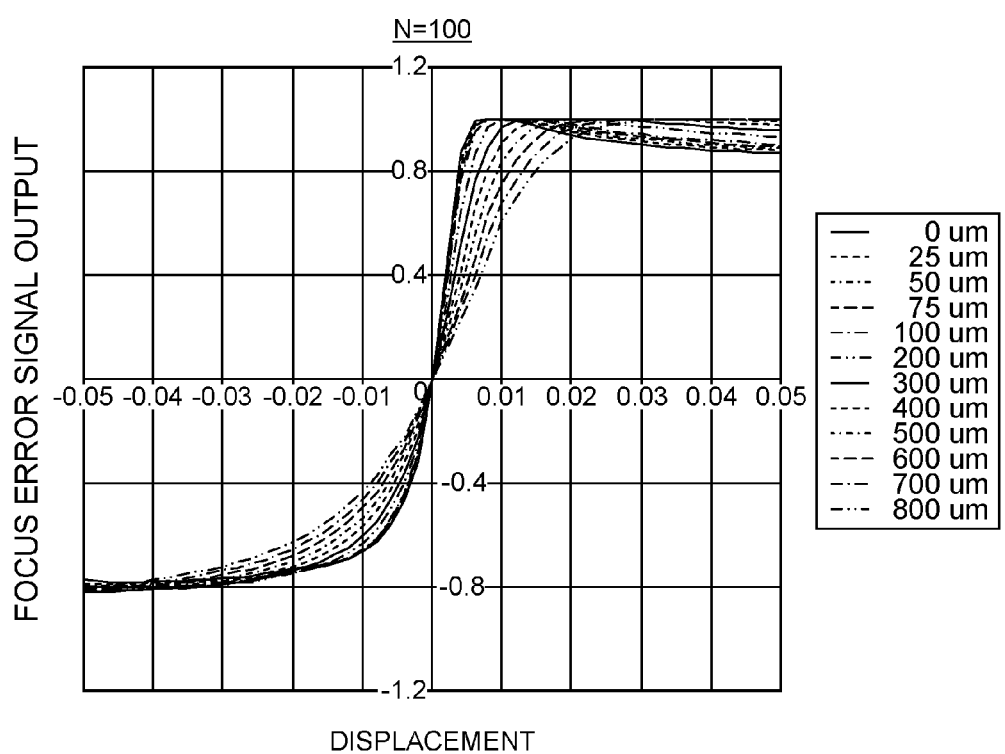
FIG. 15 is a diagram showing an evaluation result (output characteristics of focus error signals for respective processing depth) obtained by simulation.
Figure 16:
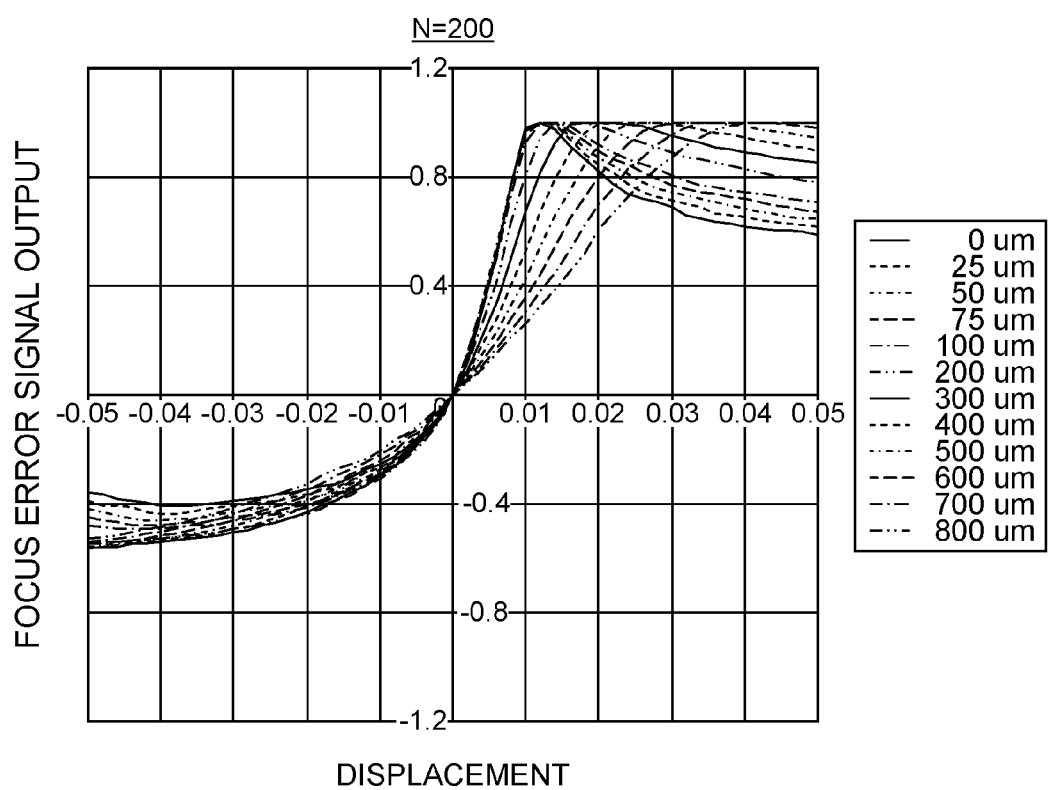
FIG. 16 is a diagram showing an evaluation result (output characteristics of focus error signals for respective processing depth) obtained by simulation.

Here, with reference to FIGS. 14 to 16, explanation is given on the result of evaluating a change in the AF characteristic for each processing depth when the spot diameter N is changed, through a simulation performed using a model substantially equivalent to the above-described laser dicing device 10 of the present embodiment.

FIGS. 14 to 16 show the output characteristics of focus error signals for respective processing depths when the spot diameter N is set to respective predetermined values. It should be noted that the unit of N is μm. Further, the optical distance D is set to 60 mm.

FIG. 14 is a diagram showing the output characteristics of focus error signals when N=10. As shown in FIG. 14, when N=10, the output characteristic curves of the focus error signals vary drastically near the focusing position (displacement=0), while the output takes almost constant values at positions other than the focusing position.

FIG. 15 is a diagram showing the output characteristics of focus error signals when N=100. As shown in FIG. 15, when N=100, compared with the case of N=10 (see FIG. 14), the output characteristic curves of the focus error signals vary gently near the focusing position. As such, it is found that it is only necessary to increase the spot diameter N in order to enlarge the focus setting range.

FIG. 16 is a diagram showing the output characteristics of focus error signals when N=200. As shown in FIG. 16, when N=200, an amplitude of the output characteristic curves of the focus error signals is decreased, and a phenomenon that inflection points appear in the curves occurs. Further, as the processing depth of the modified region becomes deeper, inclinations of the output characteristic curves (inclinations of almost linear portions in a proportional relation around the focusing position) of focus error signals become gentler, causing a problem of reduction in focus sensitivity.

As is apparent from these results, it is preferable that the spot diameter N is 5 μm or greater and 50 μm or less. With this configuration, it is possible to obtain an AF characteristic which has high focus sensitivity, has a wide focus setting range, and is stable regardless of the processing depth.

It should be noted that while the present embodiment shows an example in which the detector 39 as a means for receiving reflected light of the AF laser light L2 is configured of a bisected photodiode, the detector 39 is not limited to this. Any devices capable of measuring light quantity balance (for example, quadrisected photodiode, two-dimensional imaging element, or the like) may be used.

Further, while a knife edge method is used as a method of detecting displacement of the surface of the wafer W in the present embodiment, the method is not limited to this. For example, an astigmatic method or the like may be used.

Figure 17:
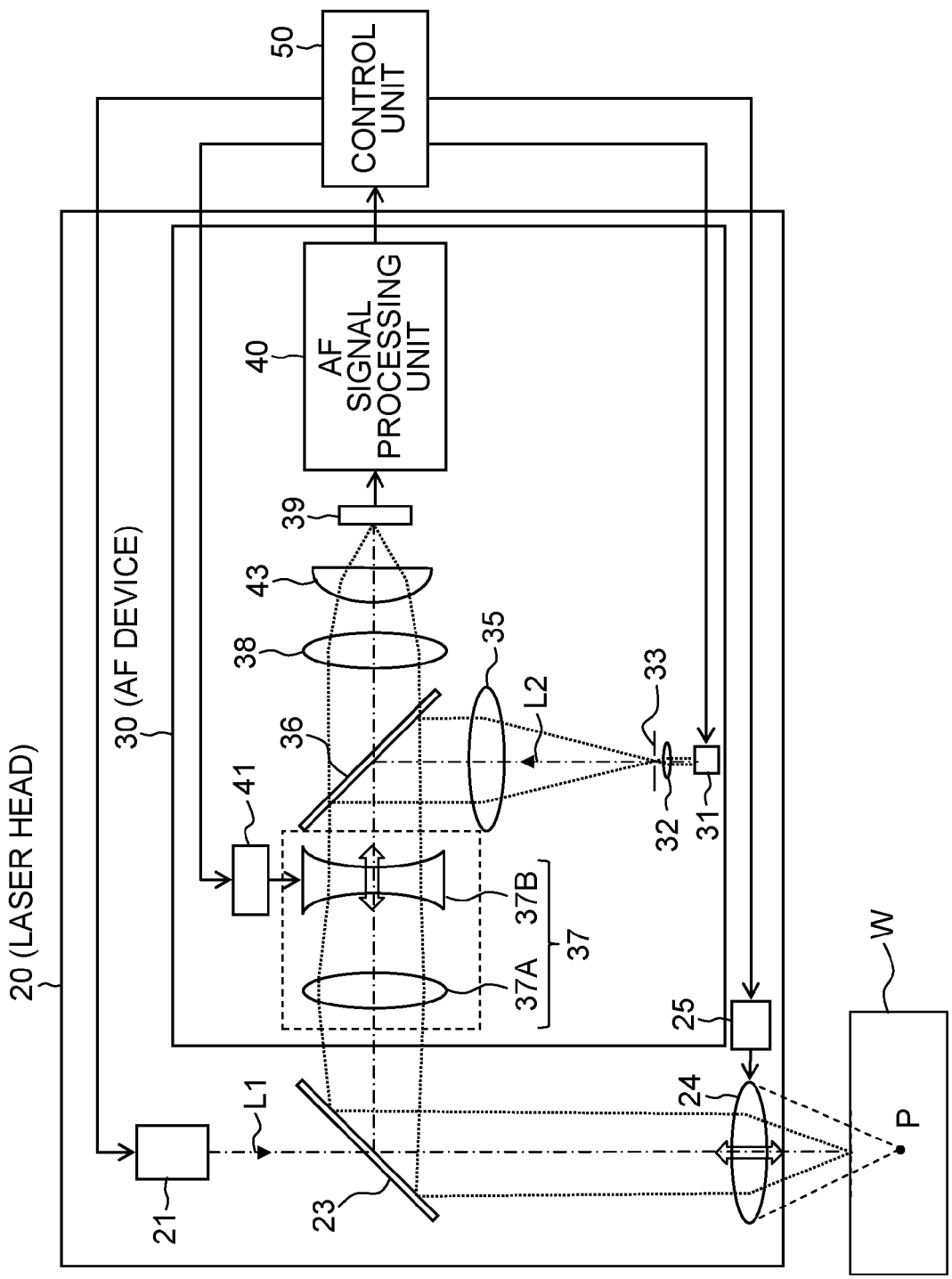
FIG. 17 is a schematic diagram showing another exemplary configuration of an AF device 30.

FIG. 17 is a schematic diagram showing another exemplary configuration of the AF device 30. It should be noted that in FIG. 17, constituent elements which are common or similar to those shown in FIG. 4 are designated by the same reference numerals or reference characters and the description thereof is omitted.

The AF device 30 shown in FIG. 17 detects the displacement of the surface of the wafer W with use of an astigmatic method. In the AF device 30, in place of the knife edge 34 shown in FIG. 4, a cylindrical lens 43 is arranged, as an astigmatism imparting means for imparting astigmatism to the reflected light of the AF laser light L2, between the imaging lens 38 and the detector 39. Further, the detector 39 is configured of a quadrisected photodiode.

Because a principle of detecting the surface of the wafer W by an astigmatic method is publicly known (see Japanese Patent Application Laid-Open No. 2009-152288, for example), the detailed explanation thereof is omitted herein. Briefly explaining, a condensed image of the reflected light of the AF laser light L2, which is formed on the light receiving surface of the quadrisected photodiode constituting the detector 39, becomes a perfect circle when the surface of the wafer W and the condensing point of the AF laser light L2 match. On the other hand, when there is a displacement (deviation) between the surface of the wafer W and the condensing point of the AF laser light L2, the condensed image becomes an ellipse extended vertically or horizontally according to the displacement direction of the surface of the wafer W, and the size of the ellipse depends on the displacement amount of the surface of the wafer W. Accordingly, the displacement of the surface of the wafer W is detectable by using this property.

Figure 18:
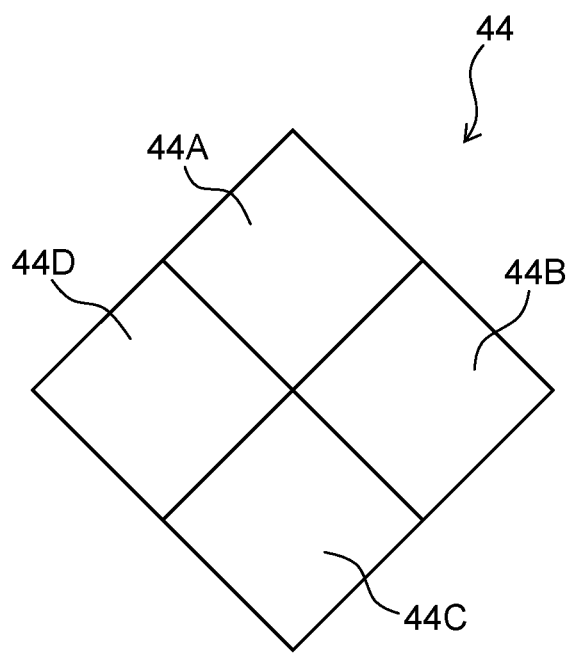
FIG. 18 is a diagram showing a light receiving surface of a quadrisected photodiode.

FIG. 18 is a diagram showing a light receiving surface of a quadrisected photodiode. As shown in the figure, a quadrisected photodiode 44 includes four light receiving elements (photoelectric conversion elements) 44A to 44D, and each of the light receiving elements 44A to 44D dividedly receives the condensed image of the reflected light of the AF laser light L2, and outputs an output signal (electrical signal) corresponding to each light amount to the AF signal processing unit 40.

The AF signal processing unit 40 calculates a focus error signal E in accordance with the following Expression (2), where A to D represent output signals output from the light receiving elements 44A to 44D, respectively.

$$E=[(A+C)-(B+D)]/[(A+C)+(B+D)] \qquad (2)$$

The control unit 50 controls driving of the first actuator 25 and the second actuator 41 as in the embodiment described above based on the focus error signal output from the AF signal processing unit 40, to thereby be able to control the condensing point of the processing laser light L1 with high accuracy so as to follow the displacement of the surface of the wafer W, without being affected by a change in the processing depth of the modified region. As such, it is possible to form the modified region with high accuracy at the desired position inside the wafer W.

Figure 19:
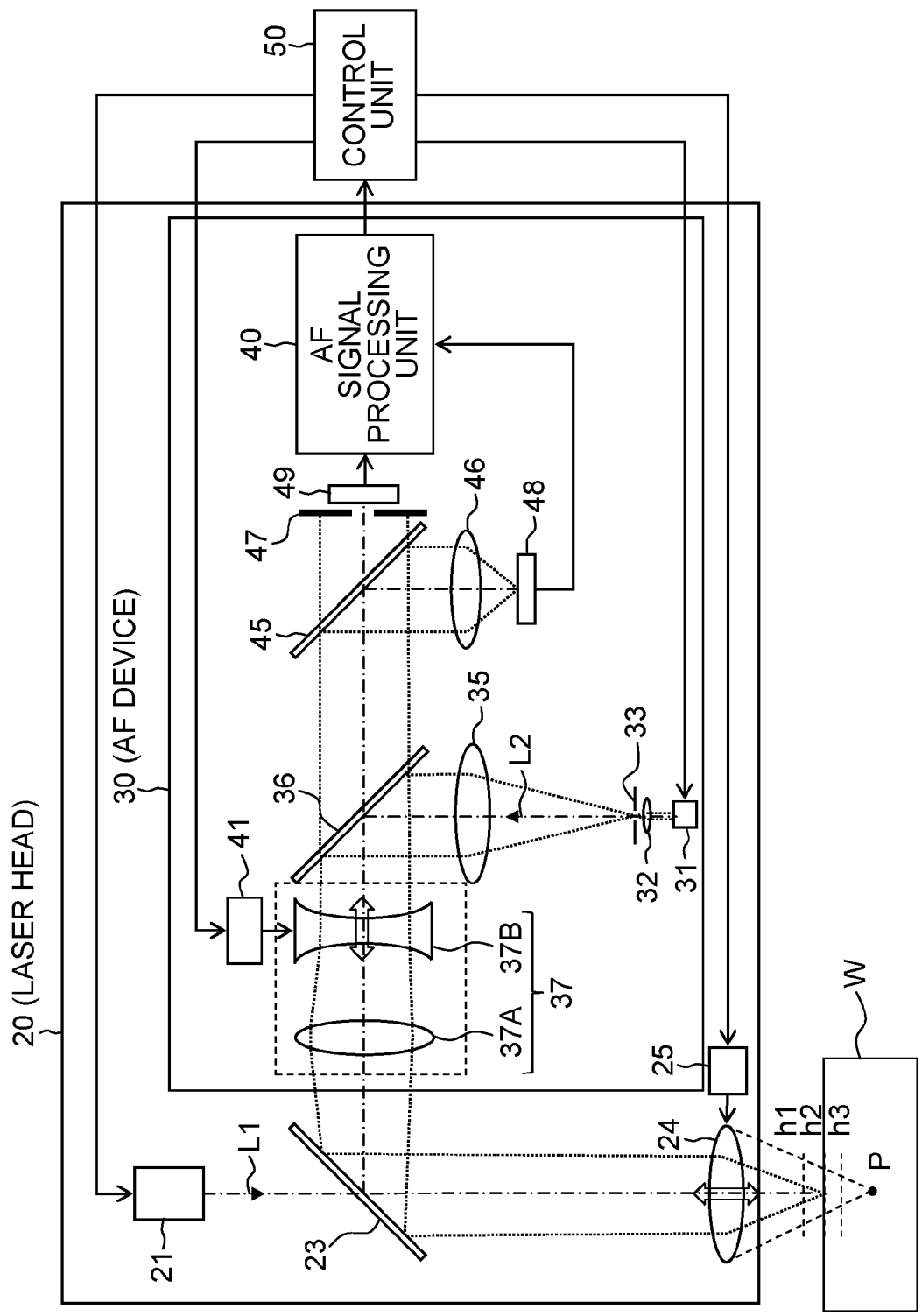
FIG. 19 is a schematic diagram showing still another exemplary configuration of the AF device 30.

FIG. 19 is a schematic diagram showing still another configuration of the AF device 30. It should be noted that in FIG. 19, constituent elements which are common or similar to those shown in FIG. 4 are designated by the same reference numerals or reference characters and the description thereof is omitted.

The AF device 30 shown in FIG. 19 detects the displacement of the surface of the wafer W, with use of a light amount ratio between reflected light received by two detectors. The AF device 30 is configured to include a half mirror 45, a condenser lens 46, a mask (light shielding plate) 47, a first detector 48, and a second detector 49, in place of the knife edge 34, the imaging lens 38, and the detector 39 shown in FIG. 4.

The AF laser light L2 emitted from the AF light source 31 passes through the condenser lens 32, the pinhole 33, and the illumination lens 35, and is reflected by the half mirror 36. Further, the AF laser light L2 passes through the focus lens group 37 and is reflected by the dichroic mirror 23, then progresses along the shared light path shared by the processing laser light L1, is condensed by the condenser lens 24, and is emitted to the wafer W.

The reflected light of the AF laser light L2, which has been reflected by the surface of the wafer W, is bent by the condenser lens 24, is reflected by the dichroic mirror 23, and passes through the half mirror 36 via the focus lens group 37. Further, the reflected light is split into two split paths by the half mirror 45. The reflected light split to one split path is condensed by 100% by the condenser lens 46 and is imaged on the light receiving surface of the first detector 48. Then, the first detector 48 outputs an output signal (electrical signal) corresponding to the received light amount, to the AF signal processing unit 40. The reflected light split to another split path passes through a hole portion of the mask 47 (light receiving region is limited), and is imaged on the light receiving surface of the second detector 49. Then, the second detector 49 outputs an output signal (electrical signal) corresponding to the received light amount, to the AF signal processing unit 40.

Based on the output signals output from the first detector 48 and the second detector 49, the AF signal processing unit 40 generates an AF signal indicating the displacement (defocusing distance) in the Z direction from the reference position of the surface of the wafer W, and outputs it to the control unit 50.

Here, a principle of detecting displacement of the surface of the wafer W is explained.

Because the reflected light received by the first detector 48 is condensed by 100% by the condenser lens 46, the light receiving amount is constant, whereby an output from the first detector 48 becomes constant. On the other hand, regarding the reflected light received by the second detector 49, because the light receiving region is limited to a center portion by the mask 47, the light receiving amount by the second detector 49 varies according to the distance from the condenser lens 24 to the surface of the wafer W, that is, a height position (Z directional position) of the surface of the wafer W. As such, an output by the second detector 49 varies according to the height position of the surface of the wafer W irradiated with the AF laser light. Accordingly, it is possible to detect the displacement of the surface of the wafer W by using such a property.

The AF signal processing unit 40 calculates a focus error signal E in accordance with the following Expression (3), where S1 and S2 represent output signals output from the first detector 48 and the second detector 49, respectively.

$$E=S1/S2 \qquad (3)$$

The control unit 50 controls driving of the first actuator 25 and the second actuator 41 as in the case of the above-described embodiment based on the focus error signal output from the AF signal processing unit 40, to thereby be able to control the condensing point of the processing laser light L1 with high accuracy so as to follow the displacement of the surface of the wafer W without being affected by a change in the processing depth of the modified region, and to form the modified region at a desired position inside the wafer W with high accuracy.

It should be noted that the detector 39 is not limited to a quadrisected photodiode, and may be any device capable of measuring a light amount balance. For example, a two-dimensional imaging element or the like may be used.

While the embodiment of the present invention has been described, the present invention is not limited to the example described above. As a matter of course, various modifications and variations can be made within a range not deviating from the scope of the present invention.

What is claimed is:

1. A laser dicing device which forms a modified region inside a wafer by condensing a first laser light inside the wafer, comprising:
   a first laser light source configured to emit the first laser light;
   a second laser light source configured to emit a second laser light to be reflected by a surface of the wafer, the second laser light source having a light path which is partially shared with a light path of the first laser light;
   a condenser lens configured to condense the first laser light and the second laser light, the condenser lens being arranged on a first shared light path between the light path of the first laser light and the light path of the second laser light;
   a light splitter which is arranged on the light path of the second laser light and is configured to split a reflected light of the second laser light reflected by the surface of the wafer from the light path of the second laser light to a split path;
   a pinhole arranged between the second laser light source and the light splitter;
   a focus error signal generator which includes a light detector configured to receive the reflected light of the second laser light having been split to the split path by the light splitter and is configured to generate a focus error signal indicating a distance between a condensing point of the second laser light and the surface of the wafer, based on the reflected light of the second laser light which is received by the light detector;

a controller configured to move the condenser lens in a thickness direction of the wafer based on the focus error signal so as to make a distance between the condenser lens and the surface of the wafer constant; and a condensing point adjuster configured to adjust a position of the condensing point of the second laser light in the thickness direction of the wafer in a state where a position of a condensing point of the first laser light is fixed, wherein the condensing point adjuster is at a position on the light path of the second laser light independent from the first shared light path, and the condensing point adjuster is arranged on a second shared light path between the second laser light and the reflected light of the second laser light.

2. The laser dicing device according to claim 1, wherein the condensing point adjuster includes a focus lens group which includes one or more lenses, and at least a part of the lenses of the focus lens group is configured to be movable along the light path of the second laser light.

3. The laser dicing device according to claim 2, wherein the focus lens group includes a positive lens and a negative lens arranged in this order from a side of the wafer, and the negative lens is configured to be movable along the light path of the second laser light.

4. The laser dicing device according to claim 3, wherein an optical distance between an exit pupil of the condenser lens and the positive lens is 120 mm or less.

5. The laser dicing device according to claim 3, wherein a focal distance of the positive lens is 20 mm or greater and 80 mm or less.

6. The laser dicing device according to claim 3, wherein a difference between the focal distance of the positive lens and a focal distance of the negative lens is 2 mm or greater and 15 mm or less.

7. The laser dicing device according to claim 3, wherein a diameter of a condensed image of the first laser light condensed by the condenser lens and emitted to the surface of the wafer is 5 μm or greater and 50 μm or less.

8. The laser dicing device according to claim 1, wherein the focus error signal generator generates the focus error signal by a knife edge method.

9. The laser dicing device according to claim 1, wherein the focus error signal generator generates the focus error signal by an astigmatic method.

10. A dicing method in which a modified region is formed inside a wafer by condensing a first laser light inside the wafer, comprising:

a laser light emitting step of emitting the first laser light from a first light source and a second laser light to be reflected by a surface of the wafer from a second light source;

a condensing step of condensing the first laser light and the second laser light by a condenser lens being arranged on a first shared light path between a light path of the first laser light and a light path of the second laser light;

a light splitting step of splitting a reflected light of the second laser light reflected by the surface of the wafer from the light path of the second laser light to a split path, by a light splitter which is arranged on the light path of the second laser light;

a focus error signal generation step of receiving the reflected light of the second laser light having been split to the split path in the light splitting step by a light detector and generating a focus error signal indicating a distance between a condensing point of the second laser light and the surface of the wafer, based on the reflected light of the second laser light which is received by the light detector;

a control step of moving the condenser lens in a thickness direction of the wafer based on the focus error signal so as to make a distance between the condenser lens and the surface of the wafer constant; and a condensing point adjusting step of adjusting a position of the condensing point of the second laser light in the thickness direction of the wafer in a state where a position of a condensing point of the first laser light is fixed by a condensing point adjuster which is at a position on the light path of the second laser light independent from the first shared light path, and is arranged on a second shared light path between the second laser light and the reflected light of the second laser light, wherein a pinhole is arranged between the second laser light source and the light splitter.

11. The dicing method according to claim 10, wherein the condensing point adjuster adjusts the position of the condensing point of the second laser light in the thickness direction of the wafer by moving, along the light path of the second laser light, at least a part of lenses of a focus lens group which includes one or more lenses.

12. The dicing method according to claim 11, wherein the focus lens group includes a positive lens and a negative lens arranged in this order from a side of the wafer, and the condensing point adjusting step adjusts the position of the condensing point of the second laser light in the thickness direction of the wafer by moving the negative lens along the light path of the second laser light.

13. The dicing method according to claim 12, wherein an optical distance between an exit pupil of the condenser lens and the positive lens is 120 mm or less.

14. The dicing method according to claim 12, wherein a focal distance of the positive lens is 20 mm or greater and 80 mm or less.

15. The dicing method according to claim 12, wherein a difference between the focal distance of the positive lens and a focal distance of the negative lens is 2 mm or greater and 15 mm or less.

16. The dicing method according to claim 12, wherein a diameter of a condensed image of the first laser light condensed by the condenser lens and emitted to the surface of the wafer is 5 μm or greater and 50 μm or less.

17. The dicing method according to claim 10, wherein in the focus error signal generation step, the focus error signal is generated by a knife edge method.

18. The dicing method according to claim 10, wherein in the focus error signal generation step, the focus error signal is generated by an astigmatic method.

* * * * *